(12) United States Patent
Pachamuthu et al.

(10) Patent No.: US 8,778,749 B2
(45) Date of Patent: Jul. 15, 2014

(54) AIR ISOLATION IN HIGH DENSITY NON-VOLATILE MEMORY

(75) Inventors: Jayavel Pachamuthu, Yokkaichi (JP); Vinod R. Purayath, Santa Clara, CA (US); George Matamis, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/348,619

(22) Filed: Jan. 11, 2012

(65) Prior Publication Data

US 2012/0178235 A1 Jul. 12, 2012

Related U.S. Application Data

(60) Provisional application No. 61/432,189, filed on Jan. 12, 2011.

(51) Int. Cl.
*H01L 21/764* (2006.01)
(52) U.S. Cl.
USPC ........... 438/201; 438/221; 438/257; 438/422; 257/E21.573
(58) Field of Classification Search
USPC .......... 438/412, 421, 422, E21.573, 201, 221, 438/257; 257/E21.573
See application file for complete search history.

(56) References Cited

U.S. PATENT DOCUMENTS

| | | | |
|---|---|---|---|
| 7,511,994 B2 | 3/2009 | Aritome | |
| 7,737,015 B2 | 6/2010 | Kohli et al. | |
| 7,795,080 B2 | 9/2010 | Orimoto et al. | |
| 7,800,155 B2 | 9/2010 | Matsuno | |
| 7,863,190 B1 | 1/2011 | Papasouliotis | |
| 7,884,415 B2 | 2/2011 | Nagano | |
| 7,905,959 B2 | 3/2011 | Tzu et al. | |
| 8,053,347 B2 | 11/2011 | Kang et al. | |
| 8,129,264 B2 | 3/2012 | Kim et al. | |
| 8,325,529 B2 | 12/2012 | Huang et al. | |
| 8,362,542 B2 | 1/2013 | Kang et al. | |
| 8,383,479 B2 | 2/2013 | Purayath | |
| 2006/0194390 A1 | 8/2006 | Imai et al. | |
| 2007/0184615 A1 | 8/2007 | Brazzelli et al. | |
| 2007/0257305 A1 | 11/2007 | Sasago et al. | |

(Continued)

FOREIGN PATENT DOCUMENTS

| | | | |
|---|---|---|---|
| EP | 1418618 A2 | 5/2004 | |
| EP | 1672687 A1 | 6/2006 | |
| EP | 1835530 A2 | 9/2007 | |

OTHER PUBLICATIONS

U.S. Appl. No. 13/472,337, filed May 15, 2012.

(Continued)

*Primary Examiner* — Minchul Yang
(74) *Attorney, Agent, or Firm* — Vierra Magen Marcus LLP

(57) ABSTRACT

Air gap isolation in non-volatile memory arrays and related fabrication processes are provided. Air gaps are formed at least partially in isolation regions between active areas of the substrate. The air gaps may further extend above the substrate surface between adjacent layer stack columns. A sacrificial material is formed at least partially in the isolation regions, followed by forming a dielectric liner. The sacrificial material is removed to define air gaps prior to forming the control gate layer and then etching it and the layer stack columns to form individual control gates and columns of non-volatile storage elements.

20 Claims, 30 Drawing Sheets

(56) References Cited

U.S. PATENT DOCUMENTS

| | | |
|---|---|---|
| 2008/0003743 A1 | 1/2008 | Lee |
| 2008/0283898 A1 | 11/2008 | Kuniya |
| 2009/0059669 A1 | 3/2009 | Toriyama et al. |
| 2009/0212352 A1 | 8/2009 | Aoyama et al. |
| 2009/0267131 A1 | 10/2009 | Nitta |
| 2010/0019311 A1* | 1/2010 | Sato et al. ............... 257/326 |
| 2010/0127320 A1 | 5/2010 | Nishihara et al. |
| 2010/0230741 A1 | 9/2010 | Choi et al. |
| 2011/0057250 A1 | 3/2011 | Higashi |
| 2011/0303967 A1 | 12/2011 | Harari et al. |
| 2011/0309425 A1 | 12/2011 | Purayath et al. |
| 2011/0309426 A1 | 12/2011 | Purayath et al. |
| 2011/0309430 A1 | 12/2011 | Purayath et al. |
| 2012/0049245 A1 | 3/2012 | Bicksler et al. |
| 2012/0126303 A1 | 5/2012 | Arai et al. |
| 2012/0126306 A1 | 5/2012 | Kawaguchi et al. |

OTHER PUBLICATIONS

U.S. Appl. No. 13/712,788, filed Dec. 12, 2012.
U.S. Appl. No. 13/768,934, filed Feb. 15, 2013.
Ragunathan, Shyam, et al., "Investigation of Ballistic Current in Scaled Floating-gate NAND FLASH and a Solution," IEEE International Electron Devices Meeting (IEDM), Dec. 2009, pp. 34.1.1-34.1.4.
Ragunathan, Shyam, et al., "Investigation of Ballistic Current in Scaled Floating-gate NAND FLASH and a Solution," Powerpoint Presentation, IEEE International Electron Devices Meeting (IEDM), Dec. 2009, pp. 1-38.
International Search Report & The Written Opinion of the International Searching Authority dated Apr. 17, 2012, International Application No. PCT/US2012/021081.
International Preliminary Report on Patentability dated Jul. 16, 2013, International Application No. PCT/US2012/021081.

\* cited by examiner

AIR ISOLATION IN HIGH DENSITY NON-VOLATILE MEMORY

PRIORITY CLAIM

The present application claims priority from U.S. Provisional Patent Application No. 61/432,189, entitled "Air Isolation in High Density Non-Volatile Memory" by Pachamuthu, et al., filed Jan. 12, 2011, incorporated by reference herein in its entirety.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

DETAILED DESCRIPTION

Figure 1:
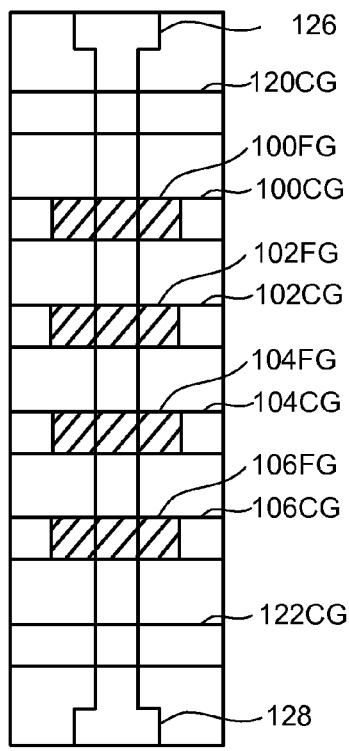
FIG. 1 is a top view of a NAND string.
Figure 2:
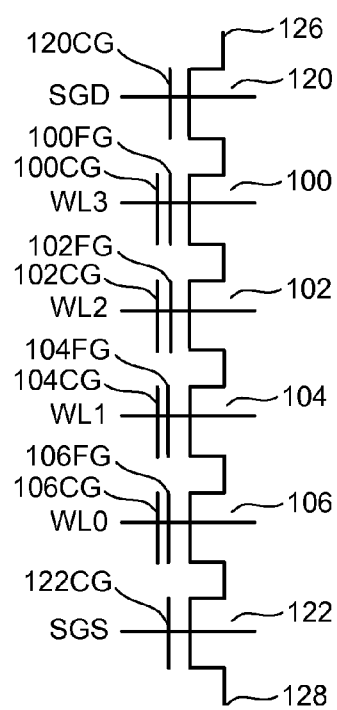
FIG. 2 is an equivalent circuit diagram of the NAND string depicted in FIG. 1.

Embodiments of the present disclosure are directed to high-density semiconductor memory, and more particularly to electrical isolation between discrete devices in non-volatile memory. Electrical isolation is provided, at least in part, by air gaps that are formed in the column (bit line) direction and/or air gaps that are formed in the row (word line) direction. The bit line air gaps are formed using sacrificial materials that are removed before active area layer stack etching to define control gates and charge storage regions. Non-volatile memory arrays and related methods of fabrication are provided.

Air gaps formed in the column direction, referred to as bit line air gaps, can provide electrical isolation between devices adjacent in the row direction. For example, adjacent columns of non-volatile storage elements, such as adjacent strings in a NAND type non-volatile memory, can be isolated using air gaps that are formed in the substrate between active areas underlying the adjacent columns. Although principally described with respect to NAND type non-volatile memory, it will be understood that the various air gaps described herein can be utilized in other arrays utilizing column and/or row arrangements for storage elements.

In one embodiment, air gaps are formed at least partially in isolation regions between active areas of the substrate. The air gaps may further extend above the substrate surface between adjacent layer stack columns. A sacrificial material is formed at least partially in the isolation regions, followed by forming a dielectric liner. The sacrificial material is removed to define air gaps prior to forming the control gate layer and then etching it and the layer stack columns to form individual control gates and columns of non-volatile storage elements.

In one embodiment, a sacrificial material is formed having a higher decomposition temperature than a subsequently-formed dielectric liner. The dielectric liner is then formed, followed by raising a temperature of the substrate to remove the sacrificial material. The dielectric liner and/or an additional insulating material can define bridges overlying the isolation regions. The bridges have a lower surface defining an upper endpoint for the air gaps. In another embodiment, the dielectric liner is etched back to form spacers and expose the underlying sacrificial material. The sacrificial material is then removed by etching. The additional insulating material may be used with the spacers to define the bridges. In another embodiment, the sacrificial material is a sacrificial resist. In one example, the dielectric liner is optically transparent to ultraviolet light at a wavelength for decomposition of the resist. In another example, the dielectric liner is not formed over the sacrificial resist, but only along the vertical sidewalls of the layer stack columns. Exposure of the substrate to the appropriate UV wavelength after forming the dielectric liner is used to define the air gaps.

In one embodiment, the formation of air gaps in the isolation regions and/or openings between layer stack columns over the active areas of the substrate is controllable. A defined height, including a definition of a lower endpoint for the air gaps and an upper endpoint for the air gaps is provided. A first insulating material in the isolation regions can be formed by a spin-on process or etch back process. An upper surface of the first insulating material defines a lower endpoint region for the air gaps. A sacrificial material is then formed in the isolation regions and/or openings. The sacrificial material can be formed using a spin-on process or etch back process to a desired height corresponding to a target upper endpoint for the air gaps. Structural stability of narrow patterns is provided. Moreover, reduced post wet etch chemistry concerns and associated detrimental effects on tunnel and sidewall dielectrics can be achieved in one embodiment. One embodiment is provided with existing tools that allow integration and cost effective techniques, including extendibility to different node sizes due to air gap height control. The tunnel and charge storage layer sidewalls may be protected to reduce or eliminate concerns of Phosphorous (charge storage layer such as polysilicon) and Boron (silicon substrate) out-diffusion due to subsequent high temperature processes.

One embodiment includes forming a plurality of layer stack columns overlying a plurality of active areas of a substrate with each active area having two vertical sidewalls and being separated from an adjacent active area by a plurality of isolation regions in the substrate. The isolation regions are partially filled with a first insulating material, followed by forming a sacrificial material over the first insulating material in each isolation region. A dielectric liner is formed vertically along the vertical sidewalls of each layer stack column and the sacrificial material is removed after forming the dielectric liner to define a plurality of bit line air gaps extending vertically from an upper surface of the first insulating material to at least the level of the surface of the substrate.

In another embodiment, a method of fabricating non-volatile storage includes forming a first layer stack column and a second layer stack column elongated in a column direction over a substrate with each layer stack column having two vertical sidewalls and including a charge storage strip over a tunnel dielectric strip. The first layer stack column overlies a first active area of the substrate and the second layer stack column overlies a second active area of the substrate. The substrate is etched to define an isolation region between the first active area and the second active area. A first insulating material is formed partially in the isolation region followed by forming a sacrificial material in the isolation region and forming a liner over the sacrificial material having a decomposition temperature higher than a decomposition temperature of the sacrificial material. A temperature of the substrate is raised to at least the decomposition temperature of the sacrificial material and an air gap is formed within the isolation region by removing the sacrificial material. An intermediate dielectric layer and a control gate layer are formed after forming the air gap, followed by etching the control gate layer, the intermediate dielectric layer, the first layer stack column and the second layer stack column to form from the control gate layer a plurality of control gates elongated in a row direction, from the charge strip of the first layer stack column a first plurality of charge storage regions, and from the charge storage strip of the second layer stack column a second plurality of charge storage regions.

One embodiment includes forming a plurality of layer stack columns overlying a plurality of active areas of a substrate with each active area having two vertical sidewalls and being separated from an adjacent active area by a plurality of isolation regions in the substrate. The isolation regions are partially filled with a first insulating material, followed by forming a sacrificial material over the first insulating material in each isolation region, forming a dielectric liner vertically along the vertical sidewalls of each layer stack column, etching back the dielectric liner to form a plurality of spacers extending vertically along the vertical sidewalls of the plurality of layer stack columns, removing the sacrificial material after forming the plurality of spacers and filling and etching back a second insulating material. Filling and etching back the second insulating material forms a plurality of bridges overlying the plurality of isolation regions and defines a plurality of bit line air gaps extending vertically from an upper surface of the first insulating material to at least the level of the surface of the substrate.

Figure 3:
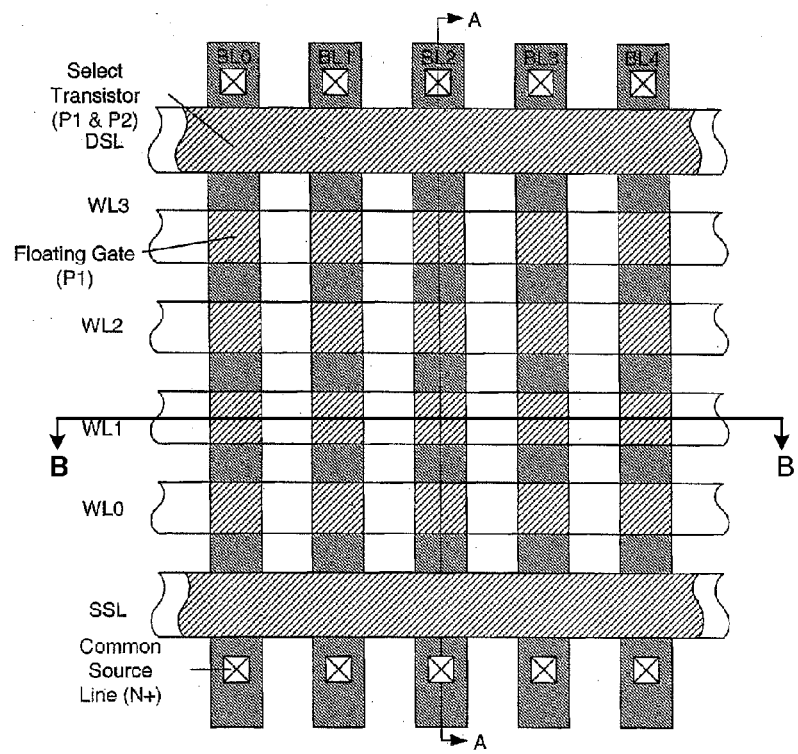
FIG. 3 is a plan view of a portion of a NAND flash memory array.
Figure 4:
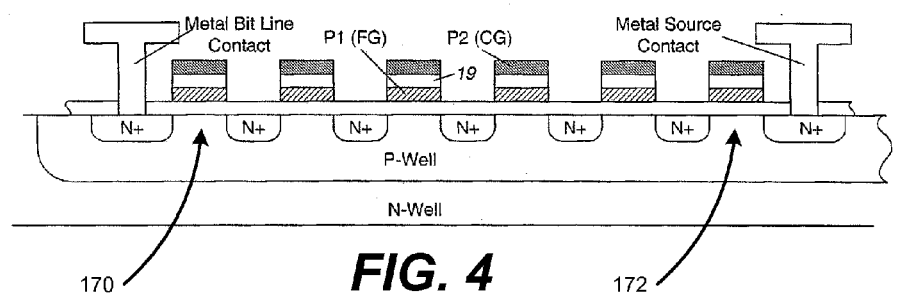
FIG. 4 is an orthogonal cross-sectional view taken along line A-A of the portion of the flash memory array depicted in FIG. 3.

A portion of a NAND memory array as can be fabricated in accordance with embodiments of the present disclosure is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774, 397 and 6,046,935.

Figure 5:
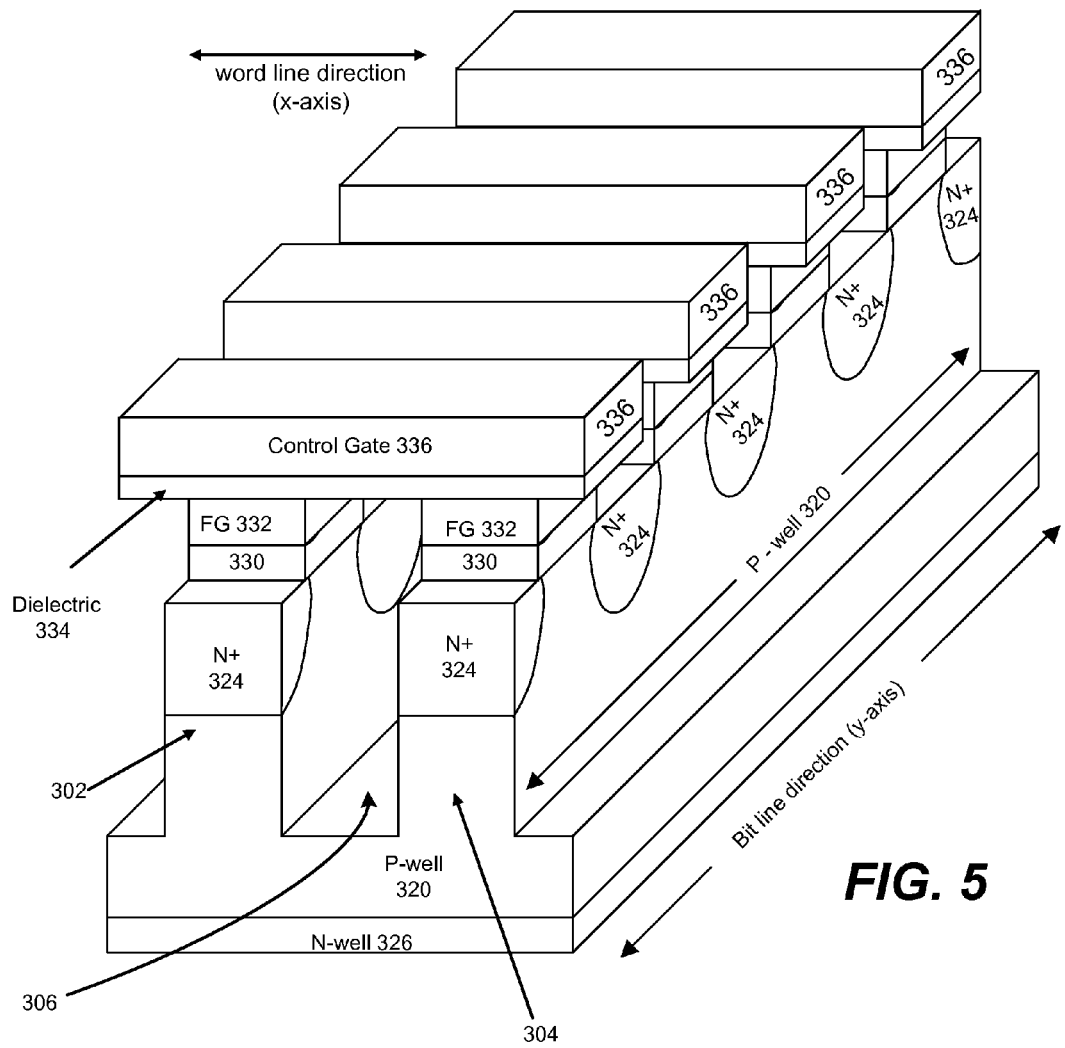
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by isolation area 306. Typically, an insulating material or dielectric is formed between adjacent NAND strings in this isolation area.

When scaling non-volatile memory storage elements, control of bit line/word line critical dimensions and characteristics are challenging when attempting to meet design rule specifications. Cell reliability characteristics may be affected by program/read disturb, electron trap/de-trap, neighbor cell coupling effects, parasitic capacitances, gate to channel and channel to channel coupling effects etc. In many instances, this is due to high electric field generation between neighboring cells when spacings are closer and different charge potential energies are created during write, verify and read operations. In addition, scaling in the conventional processes may increase these issues and lead to unintentional threshold voltage shift during write, erase and read operations.

In accordance with embodiments of the present disclosure, air gaps are introduced in the column (bit line) and/or row (word line) direction to form isolation between closely spaced components in the memory structure. Air gaps can decrease parasitic interferences between neighboring floating gates, neighboring control gates and/or between neighboring floating and control gates. Air gaps can include various material compositions and need not correspond to atmospheric air. For example, concentrations of elemental gases may vary in the air gap regions. An air gap is simply a void where no solid material is formed in the semiconductor structure. Although referred to as "air" gaps, the elemental composition of the air can include many different materials. Thus, the term "air" should not be construed as having any particular elemental composition. Any number and type of gases may be in the gaps.

Figure 6:
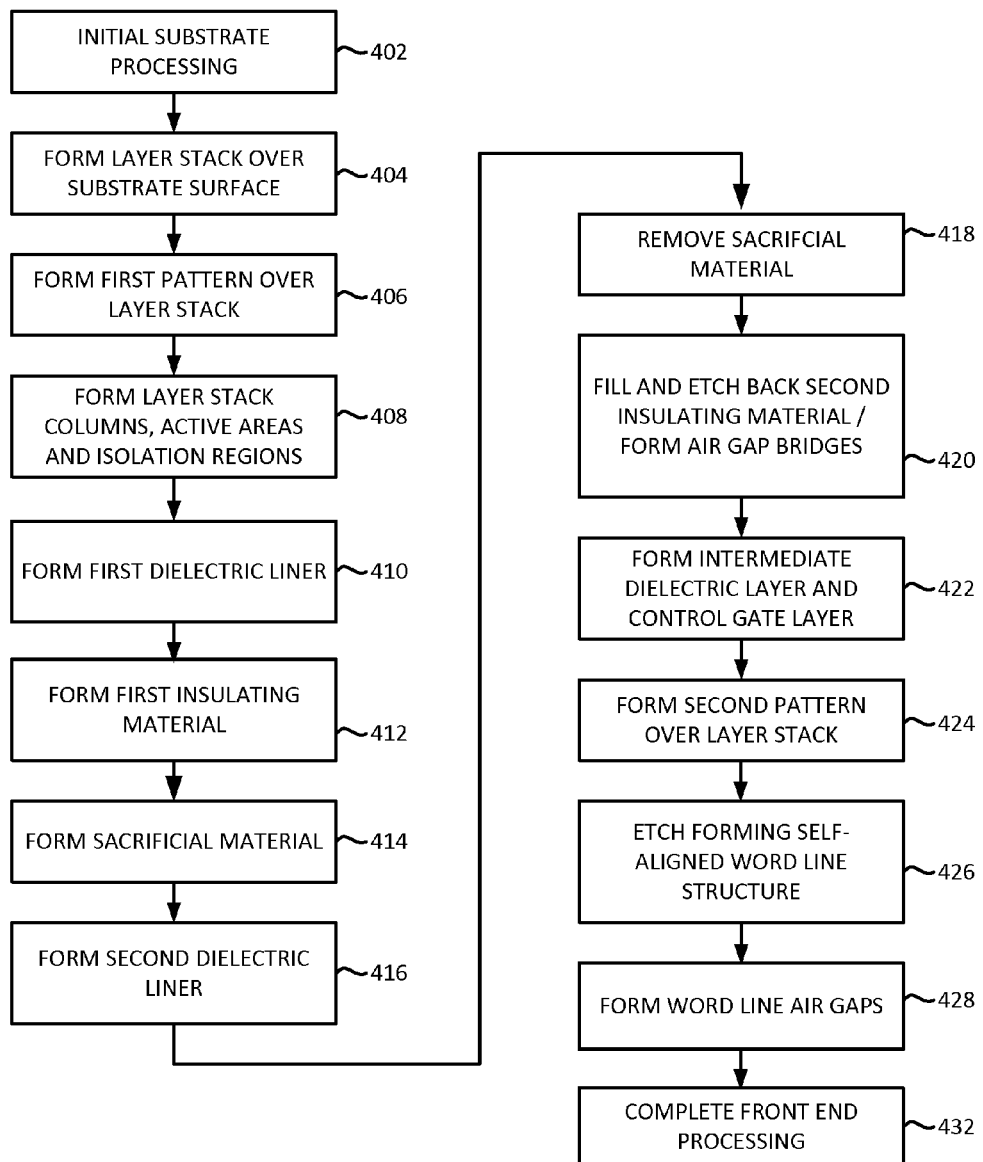
FIG. 6 is a flowchart describing a method of fabricating non-volatile storage with air gaps using a sacrificial material in accordance with one embodiment.
Figure 7A:
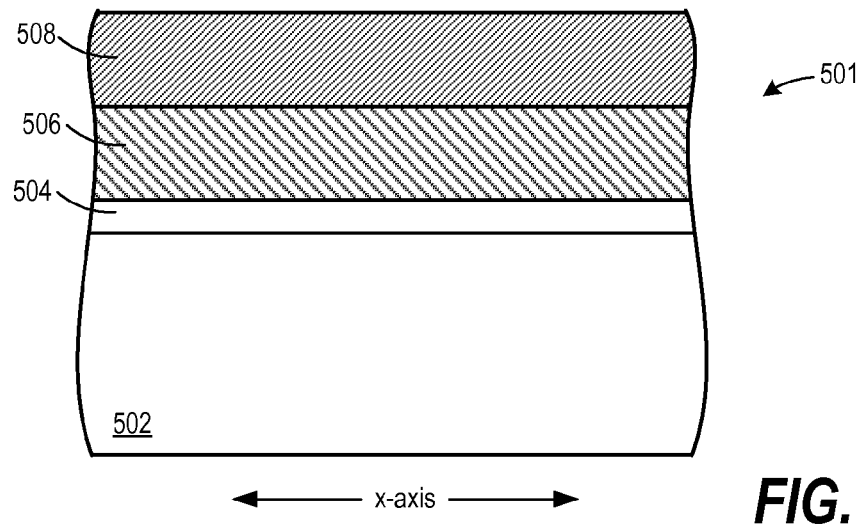
FIGS. 7A-7P are cross-sectional views through a portion of a non-volatile memory array depicting a fabrication process according to the method of FIG. 6 in one embodiment.

FIG. 6 is a flowchart describing a method of fabricating non-volatile storage in accordance with one embodiment of the disclosed technology. FIGS. 7A-7O are orthogonal cross-sectional views of a non-volatile memory array fabricated according to the method of FIG. 6 in one embodiment. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

At step 402, initial processing is performed to prepare a substrate for memory fabrication. One or more wells (e.g., a triple well) are typically formed in the substrate prior to forming a layer stack over the substrate surface. For example, a p-type substrate may be used. Within the p-type substrate, an n-type well may be created and within the n-type well a p-type well may be created. Various units of a memory array may be formed within individual p-type wells. The well(s) can be implanted and annealed to dope the substrate. A zero layer formation step may also precede well formation.

At step 404, an initial layer stack is formed over the substrate surface. FIG. 7A depicts a cross-sectional view in the x-axis (row) direction taken along a line B-B of FIG. 3. FIG. 7A depicts the results of steps 402-404 in one example. Layer stack 501 is formed over the surface of substrate 502. In this example, layer stack 501 includes a tunnel dielectric layer (TDL) 504, a charge storage layer (CSL) 506, and one or more hard mask layers 508 (e.g., oxide). One or more sacrificial layers may be formed between the charge storage layer 506 and hard masking layer(s) 508 in one embodiment. It is noted that a layer may be said to be over another layer when one or more layers are between the two layers as well as when the two layers are in direct contact.

The tunnel dielectric layer 504 is a thin layer of oxide (e.g., $SiO_2$) grown in one embodiment, although different materials and processes can be used. Chemical vapor deposition (CVD) processes, metal organic CVD processes, physical vapor deposition (PVD) processes, atomic layer deposition (ALD) processes, thermal oxidation or other suitable techniques can be used. In one example, the tunnel oxide layer is formed to a thickness of about 8 nanometers (nm). Although not shown, one or more high voltage gate dielectric regions may be formed at a peripheral circuitry region before or after forming the tunnel dielectric layer. The high voltage gate dielectric regions may be formed with a larger thickness (e.g., 30-40 nm) than the tunnel dielectric layer.

The charge storage layer 506 is a polysilicon floating gate layer in one embodiment. The vertical dimension (with respect to the substrate surface) or thickness of the charge storage layer can vary by embodiment. In one example, the charge storage layer has a vertical dimension of 30 nm. In another example, the charge storage layer has a vertical dimension of 70-80 nm. Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, a metal floating gate layer is formed to a thickness of between 10 nm and 20 nm. In another embodiment, metal thicknesses greater than 20 nm or less than 10 nm are used. In one embodiment, the metal floating gate layer is a high work function metal. In one example, the metal is ruthenium. Other metals such as titanium, tungsten, tantalum, nickel, cobalt, etc., and their alloys (e.g., TiN, WN, TaN, NiSi, CoSi, WSix) can be used.

The layer stack is patterned at step 406 with a first pattern corresponding to intended columns of the memory array. The first pattern is repetitive in the row or direction of the x-axis. The pattern also corresponds to intended active areas of the substrate which will be separated by isolation regions. In one embodiment, conventional photolithography using photoresist is used to pattern the hard mask layer 508 into strips elongated in the direction of the y-axis with spaces between strips adjacent in the direction of the x-axis. The hard mask layer may be patterned into a first sub-pattern at the memory array area and one or more different sub-patterns at the peripheral circuitry areas to define active areas in the substrate with different dimensions in the direction of the x-axis. Spacer-assisted patterning, nano-imprint patterning, and other patterning techniques can also be used to form strips of the hard mask layer at reduced features sizes. The pattern, repetitive in the second or row direction, may define a first direction of etching to form columns of the targeted memory array.

After forming the pattern, the layer stack and substrate are etched at step 408 using the pattern formed at step 406. The layer stack is etched into layer stack columns. The substrate is etched into active areas underlying the columns and isolation regions separating the active areas. The term layer stack is used to refer to the layers formed over the substrate throughout processing. Thus, layer stack 501 may refer to the collection of layer stack columns that result from etching the initial layer stack.

Figure 7B:
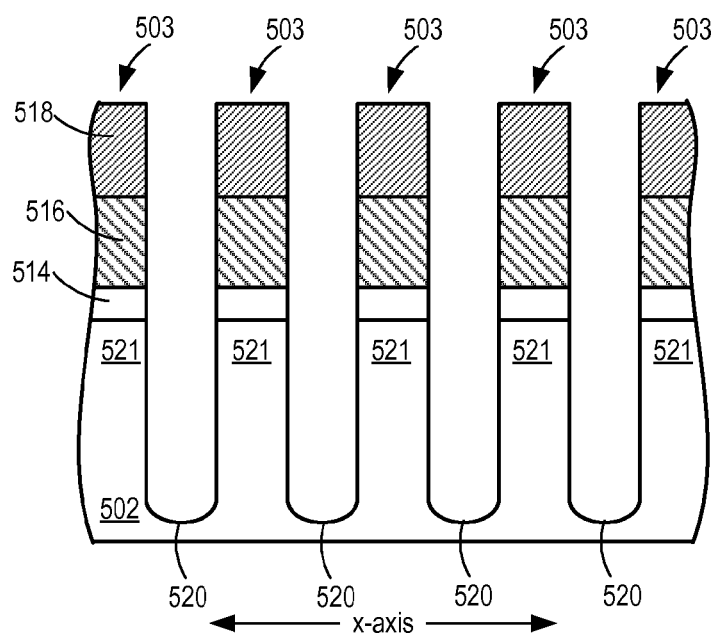

FIG. 7B depicts the memory array after etching in one example. Etching forms layer stack columns 503 that are elongated in the direction of the y-axis with spaces therebetween in the direction of the x-axis. The depiction in the direction of the x-axis shows multiple layer stack columns 503 overlying active areas 521 which are separated by isolation regions 520. Each layer stack column 503 includes a tunnel dielectric strip (TDS) 514, a charge storage strip (CSS) 516, and a hard mask strip (HMS) 518. In one example, the depth of the isolation regions in the substrate is 200 nm. Various depths can be used, however, ranging from 180-220 nm in one example. In one embodiment, reactive ion etching is used with various combinational etch chemistries to etch the different layers. Any suitable etch process(es) can be used.

At step 410, a first dielectric liner is formed along the vertical sidewalls of the isolation regions and the vertical sidewalls of the layer stack columns. At step 412, the isolation regions are partially filed with a first insulating material that provides a portion of the isolation between adjacent active areas. In one example, the fill material is selectively deposited in the isolation trenches to a desired height without etch-back, using a spin-on deposition or coating process in one embodiment. For example, the fill material 512 can be a polysilazane (PSZ) formed using a spin-on deposition or coating process. In another embodiment, a fill material can be more conventionally formed using an ALD or CVD process and etched back to a desired height within the trenches. Suitable materials for the fill layer include, but are not limited to nitrides and oxides such as enhanced high aspect ratio process oxides, non-dyed silicate glass (NSG) and high-density plasma (HDP) oxides.

Figure 7C:
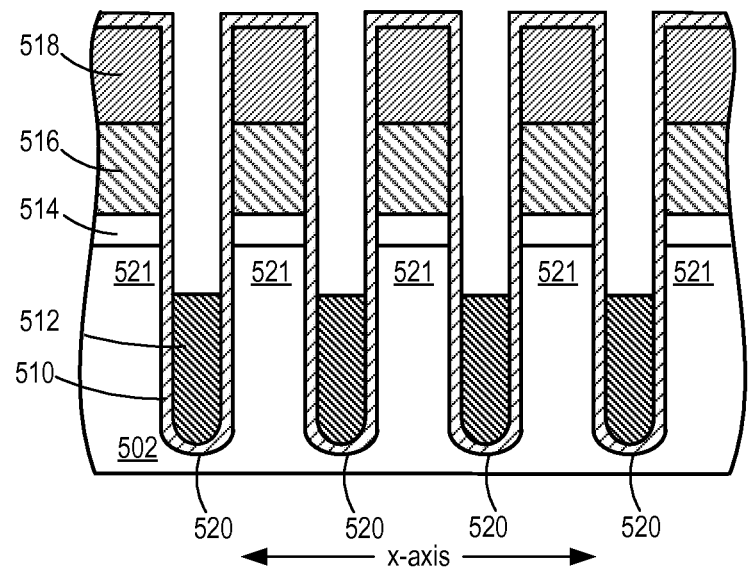

FIG. 7C depicts the device after forming a thin dielectric liner 510 along the sidewalls of the isolation regions and layer stack columns overlying active areas. The liner coats the vertical sidewalls of the layer stack columns as well as the walls of the isolation regions. In one embodiment, the liner is a high-temperature oxide (HTO) formed using a conformal deposition (e.g., ALD) or other process. Tetraethyl Orthosilicate, $Si(OC_2H_5)_4$ is used in another embodiment. Although not required, the liner is selected for it's high temperature formation in one example, providing decomposition selectivity with respect to a lower temperature sacrificial material that will be formed later. Different thicknesses of the liner may be used. In one example, the liner has a thickness of 4 nm or less. In other examples, larger thicknesses may be used. Liner 510 is formed along the vertical sidewalls of the layer stack columns 503 and the vertical sidewalls of the isolation regions 520.

FIG. 7C also depicts an insulating fill material 512 formed to a desired height within the isolation regions. In one embodiment, material 512 is a spin on dielectric (SOD) or polymer (SOP). An oxide is used for material 512 in one example although other materials can be used. A spin-on process can be used to form the fill material 512 within trenches 520 without forming the fill material over the upper surfaces of the liner 510. In one example, the distance between the upper surface of fill material 512 and the substrate surface is about 70 nm. Other dimensions may be used.

Figure 8A:
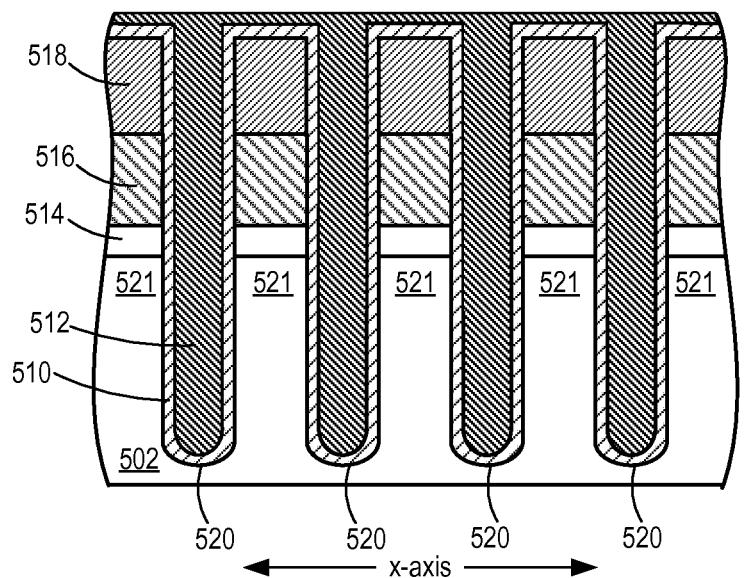
FIGS. 8A-8C are cross-sectional views through a portion of a non-volatile memory array depicting a portion of a fabrication process according to the method of FIG. 6 in one embodiment.
Figure 8B:
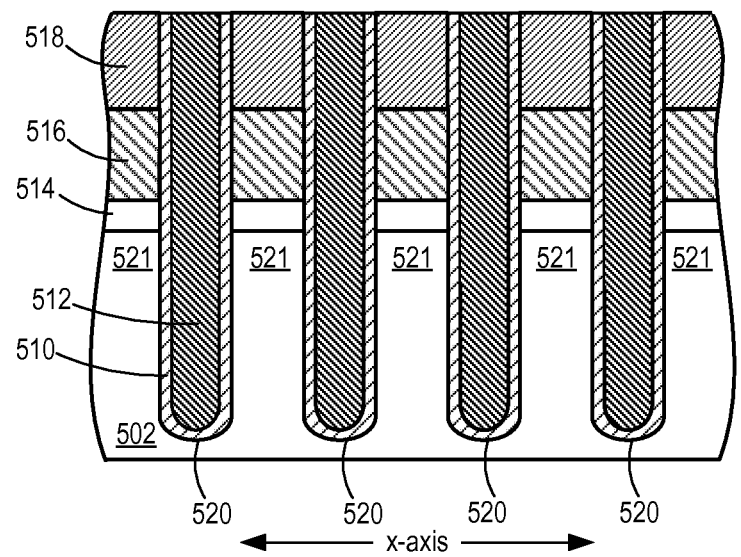
Figure 8C:
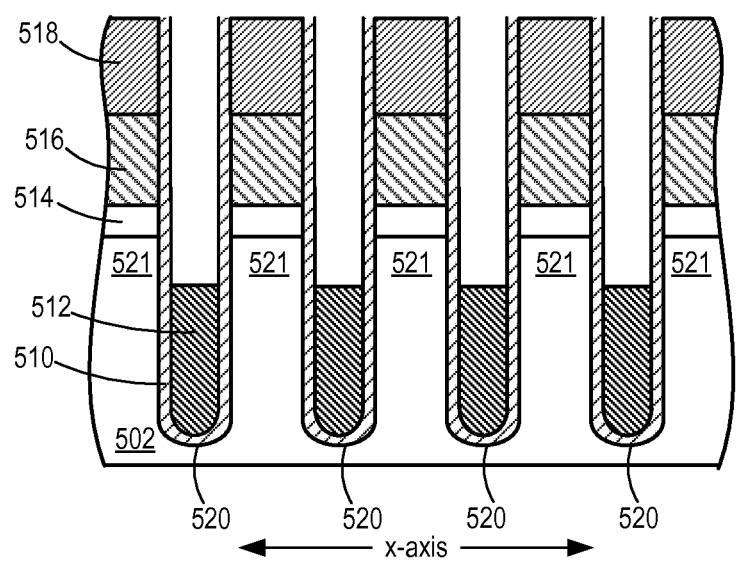

FIGS. 8A-8C show another embodiment of forming the dielectric liner 510 and fill material 512. In this example, liner 550 is formed as before, but the fill material is formed using a standard ALD or CVD process, filling isolation regions 520 as well as the spaces between adjacent layer stack columns. The dielectric liner is formed from a first dielectric material and a second, different dielectric material is used to fill the isolation regions. The second material is formed with an etch selectivity that permits etching the second dielectric material without etching the first dielectric material. The fill material is then polished (e.g., CMP) and/or etched (e.g., SH), forming a planar upper surface with sacrificial strips 518 and liner 510 as shown in FIG. 8B. Next, reactive ion etching or a wet etch chemistry is applied to recess the fill material as shown in FIG. 8C. The fill material is selectively recessed, for example by selectively etching an oxide fill material 512 with respect to nitride sacrificial strips 518. The etch is controlled to recess the fill material to a desired height within the isolation regions. In this example, the upper surface of the fill material is targeted at 70 nm below the substrate surface, but other dimensions may be used. Various distances may be used. For example, a range of 100-150 nm can be used in one embodiment. Material 512 may be subjected to less annealing than material 510 to achieve a suitable etch selectivity with respect to liner 510. In this manner, material 512 is recessed, while leaving liner 510 along the vertical sidewalls of the layer stack columns and the isolation regions.

At step 414, a sacrificial material is formed in the isolation regions. The sacrificial material completes filling of the isolation regions and extends some distance above the substrate surface. In one embodiment, the sacrificial film extends 7-10 nm above the level of the upper surface of the tunnel dielectric layer 514, but other dimensions may be used.

Figure 7D:
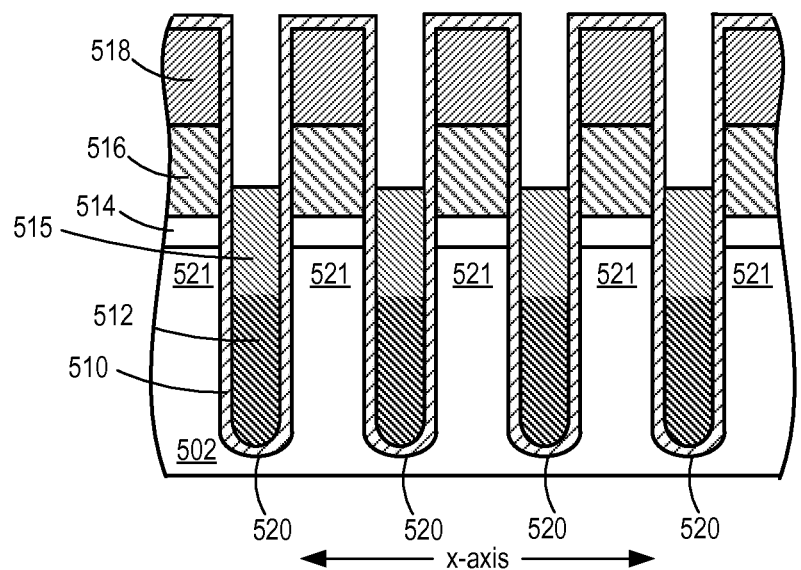

FIG. 7D depicts the results of forming a sacrificial material 515 in one embodiment. In this example, a spin-on dielectric polymer is formed in the isolation regions. As described in more detail hereinafter, the sacrificial material and processes for its removal may vary by embodiment. The sacrificial material may include, without limitation, traditional dielectrics, resists, etc. For example, polynorborene with a decomposition temperature of about 440° C. can be used. In another example, polycarbonate having a decomposition temperature of about 400° C. can be used. In other examples, cross-linked polymers such as polyneopentyl methacrylate or cyclohexyl methacrylate monomer cross-linked with ethylene glycol diacrylate may be used. Other types of materials may be suitable, including in various implementations borosilicate glass (BSG) or other type of oxide, a spin-on-carbon, polysilicon, silicon nitride (SiN) or an undensified polysilazane (PSZ) such as a PSZ-based inorganic spin-on-glass (SOG) material. A WVG curing process may be used in one example. The sacrificial film can be chosen for a high etch or decomposition selectivity with respect to the liner so that it etches at a faster rate than the liner. In one example, the etch selectivity of the sacrificial film is achieved by skipping anneals. In one example, the sacrificial material extends in the vertical direction 7-10 nm above the level of the upper surface of tunnel dielectric layer 504. In other examples, the sacrificial material may be formed to different dimensions. For example, the sacrificial material may only extend to the level of the upper surface of the tunnel dielectric layer in another embodiment, or even below this level. In other examples, the sacrificial material may extend more than 10 nm above the tunnel dielectric layer.

At step 516, a second dielectric liner is formed over the exposed upper surface of the sacrificial film and exposed vertical sidewalls of the first dielectric liner. In one embodiment, the dielectric liner is a low temperature or ultra-low temperature formation oxide. The formation temperature of the dielectric liner is selected so that it can be formed at below the decomposition temperature of the sacrificial material 515. This enables the formation of the liner without removing the sacrificial film in one embodiment.

Figure 7E:
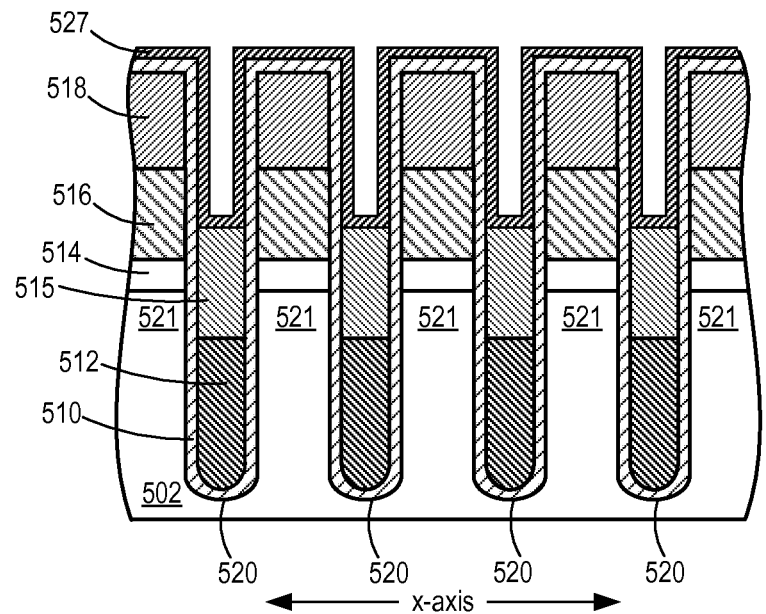

FIG. 7E depicts the results of step 516 in one embodiment. A deposition process is used in one example to form a layer of silicon dioxide ($SiO_2$) or other dielectric 527 over the upper surface of sacrificial material 515 and along the vertical sidewalls and upper surfaces of liner 510. In one embodiment, liner 527 is an oxide formed using an ultra-low temperature (ULT) deposition process. For example, a room temperature deposition process can be used. A wide range of temperatures may be used at less than the decomposition temperature of sacrificial material 515 so that the sacrificial material is not removed. In another example, the liner 527 is a layer of undoped silicate glass (USG), doped silicate glass (FSG) or combinations of the two. Doped or undoped silicate glasses are more porous than $SiO_2$, and may increase the decomposition rate of material 515 to aid in later processing steps. The thickness of liner 527 may also affect the decomposition rate of sacrificial material 515. In one example, the liner has a thickness of 4 nm or less, but other dimensions may be used.

At step 418, the sacrificial material is removed. Various processes may be used. The sacrificial may be removed by laser exposure, thermal decomposition or etching in various embodiments. In one embodiment, the substrate temperature is raised to a level at or above the decomposition temperature of the sacrificial material. Raising the temperature of the substrate, and consequently that of the sacrificial film, causes the natural decomposition of the sacrificial material and the creation of voids in the isolation regions and optionally a portion of the opening between adjacent layer stack columns. When the temperature reaches the decomposition temperature of the polymer, thermal decomposition will occur. Gaseous decomposition products are formed which can permeate through the liner 527 formed over the sacrificial material.

Figure 7F:
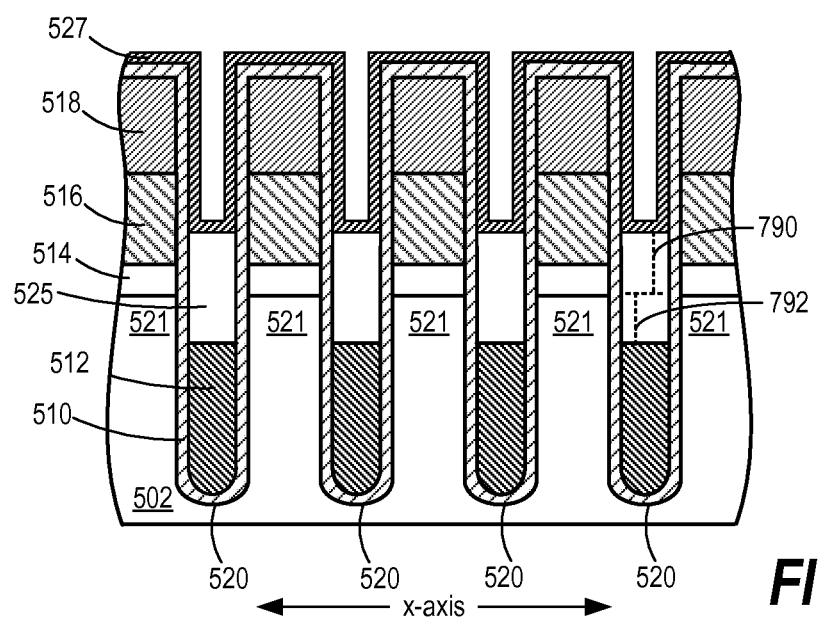

The decomposition and evacuation of the byproducts leaves a void behind in the spaces previously occupied by the sacrificial material as shown in the example of FIG. 7F. These voids form air gaps 525 in the isolation regions between adjacent active areas of the substrate. The air gaps extend from the upper surface of the first insulating material 512 to the lower surface of the liner 527. As earlier described with respect to the dimensions of the sacrificial material, the air gaps may extend from about 70 nm below the level of the substrate surface to about 7-10 nm above the level of the upper surface of the tunnel dielectric layer 504. Other dimensions for the air gaps may be used. For example, the air gaps may be entirely within the substrate, not extending above the upper surface of the substrate in other examples. Moreover, the air gaps may be formed deeper within the substrate or higher above the upper surface of the tunnel dielectric layer 404 than described. In the row direction, the bit line air gaps may extend the full distance between the isolation region sidewalls or some portion thereof, for example where a liner or partial dielectric fill is used. Likewise, above the substrate surface, the air gaps may extend the full distance between adjacent columns of storage elements or some portion thereof, for example where a liner, spacer or partial dielectric fill is used. In the column direction, the bit line air gaps may extend the length of a column of storage elements, such as may be formed for a block of NAND non-volatile storage elements. The air gaps may extend beyond an entire column or less than the entire length of a column.

FIG. 7F further demonstrates an upper air gap dimension 790, which corresponds to the distance between the level of the upper surface of the substrate and the lower surface of the liner 527. The upper dimension 790 may be tuned or controlled by controlling the height of the sacrificial fill material 515. FIG. 7F further demonstrates that the lower air gap dimension 792, which corresponds to the distance between the level of the upper surface of the substrate and the upper surface of the first insulating layer 512, may be tuned or controlled by controlling the height of the fill material in the isolation regions.

At step 420, a second insulating material is formed and etched back to form air gap bridges that extend between adjacent layer stack columns, overlying each of the bit line air gaps. The air gap bridges may be formed from the second dielectric liner in one embodiment. The etch-back may target a remaining thickness equal to the thickness of the second dielectric liner. The bridges may also contain some portion of the insulating fill material in another embodiment.

Figure 7G:
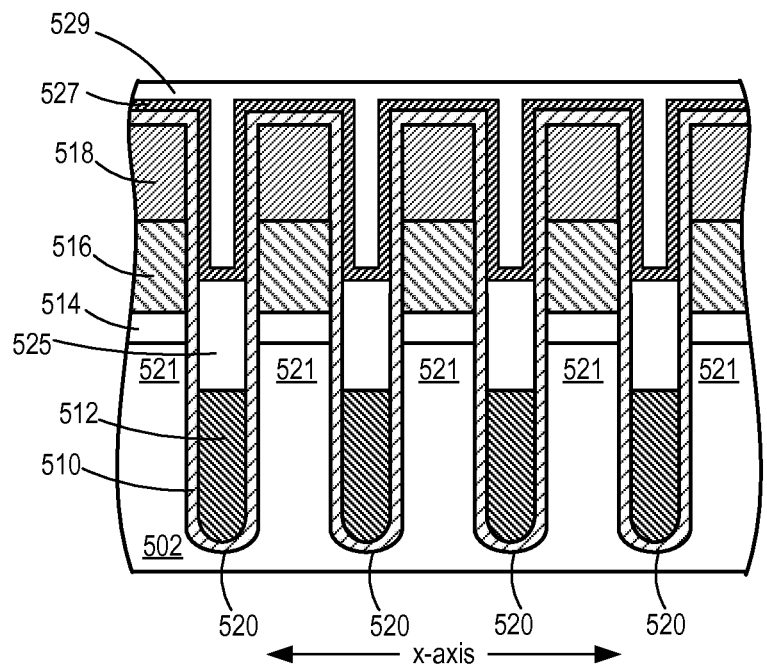
Figure 7H:
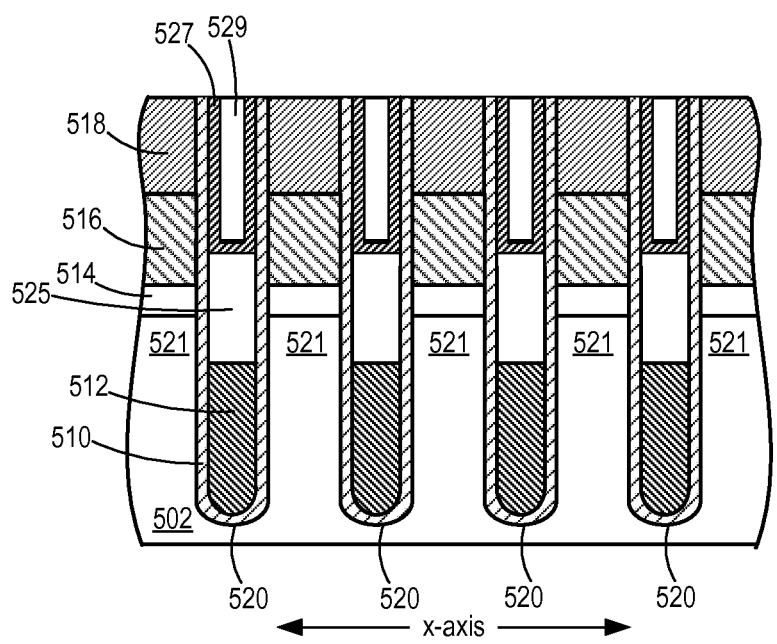
Figure 7I:
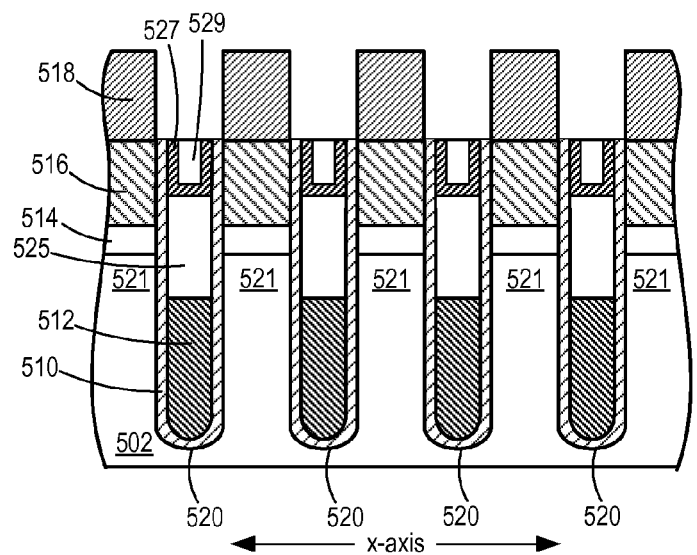
Figure 7J:
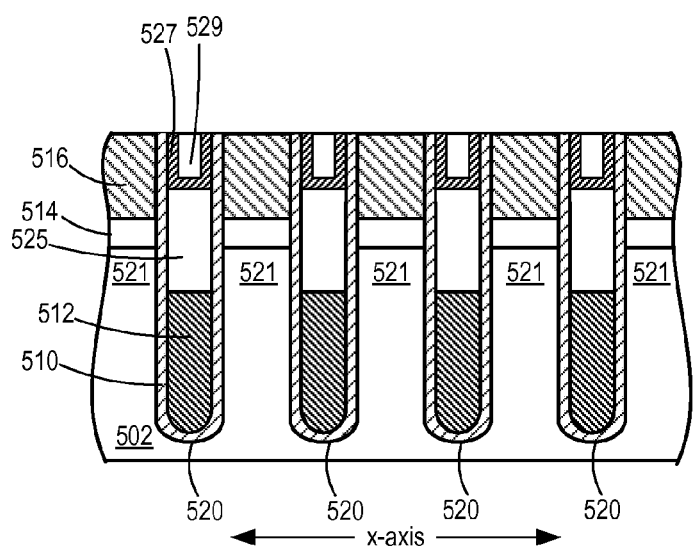

FIG. 7G depicts a second insulating material 529 formed over the substrate after forming the bit line air gaps. The second fill material is formed in the remaining spaces between adjacent layer stack columns. The insulating material is formed over the horizontal portion of the second dielectric liner, filling the openings between adjacent vertical portions of the second dielectric liner. In one embodiment the insulating material is an oxide (e.g., NSG, eHARP, HDP or HTO) but other dielectric materials may be used. The fill material is polished or etched back as shown in FIG. 7H to remove portions of it, the second dielectric liner 527 and the first dielectric liner 510 that extend over horizontal surfaces of the layer stack columns. The polishing or etch back forms a substantially planar upper surface. The liners 510, 527 and fill layer 529 are then recessed as shown in FIG. 7I. In one embodiment, these layers are recessed to about the height of the upper surface of the charge storage layer 516. The sacrificial strips 518 (e.g., SiN) are then removed as shown in FIG. 7J. In one embodiment a wet etch process such as a hot phosphoric etch ($H_3PO_4$) is used.

Figure 7K:
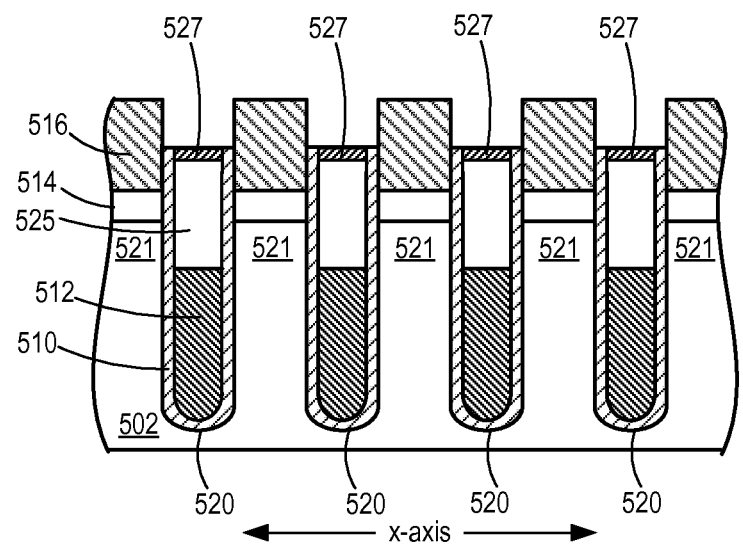

After removing the sacrificial strips, the liners 510 and 527 and fill material 529 are again recessed again as shown in FIG. 7K. A dry reactive ion etching process is used in one embodiment, although other processes including wet etch chemistries may also be used. Process control is utilized to ensure that some amount of the liner oxide 527 remains after etch back so that the air gaps 525 are not exposed. In one embodiment, all of the fill layer 529 may be removed, leaving only portions of the liner 527 that extend horizontally over the air gaps 525 as shown. In other examples, the etch back process may leave more material, including some portion of the fill layer 529.

Figure 7L:
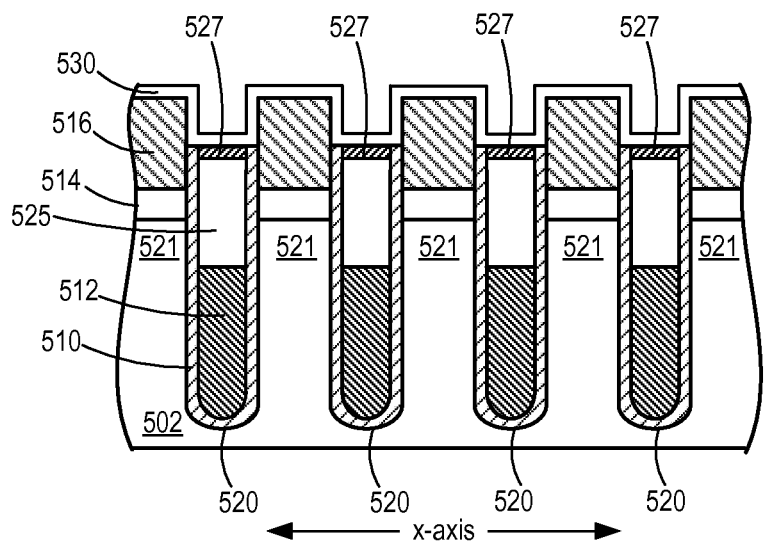
Figure 7M:
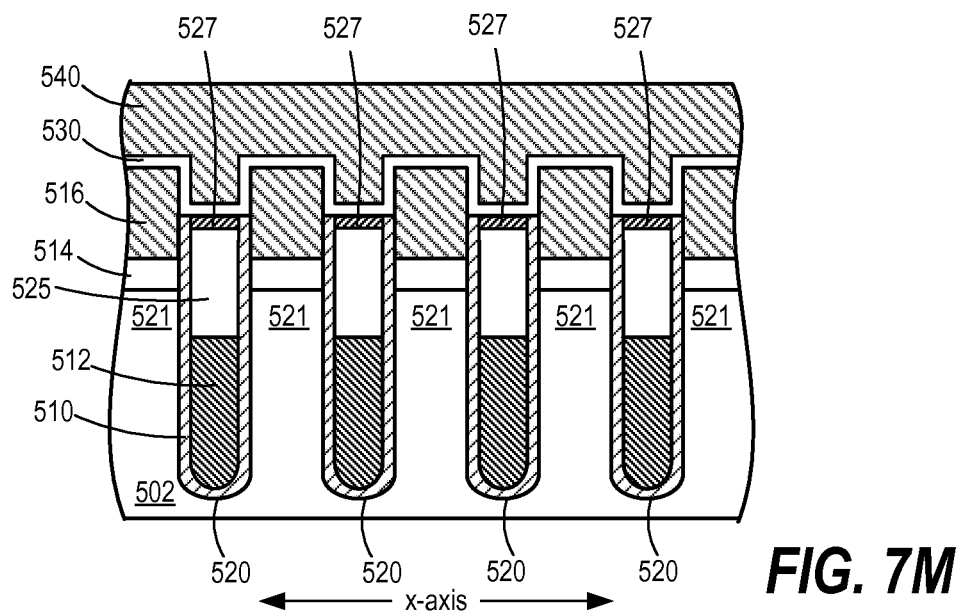

After etching back the liners and fill layer, an intermediate dielectric layer and control gate layer are formed at step 422. FIG. 7L depicts formation of an intermediate dielectric layer 530 and FIG. 7M depicts formation of a control gate layer 540 in one embodiment. The intermediate dielectric layer is a triple layer of oxide, nitride and oxide (ONO) in one embodiment. In one embodiment, a high-K (dielectric constant) material is used for the intermediate dielectric to reduce or eliminate charge transfer through the intermediate layer while providing enhanced control gate to floating gate coupling. Conformal deposition processes are used in one embodiment to form the intermediate dielectric layer along the vertical sidewalls of the charge storage layer while leaving spaces or openings therebetween that will be filled with the control gate material. High dielectric constant (K) materials are used in one embodiment. High K materials can enhance coupling between the control gates and floating gates. A self-aligned high-K approach is utilized in one embodiment to reduce or eliminate charge transfer through the intermediate dielectric material.

The control gate layer may be formed of one or more layers of polysilicon and/or metals. The polysilicon can be doped in-situ or after formation. In another embodiment, the control gate layer is formed at least partially of a metal. In one example, the control gate layer has a lower portion that is formed from polysilicon and an upper portion that is formed from metal. A barrier layer may be formed between the polysilicon and the metal, to prevent silicidation. In one embodiment, the control gate is entirely metal. Metals in various embodiments may include tungsten, although other metals may be used. The control gate layer may be formed by chemical vapor deposition (CVD), atomic layer deposition (ALD), plating, or another technique.

At step 424, a second pattern is formed over the layer stack. The second pattern is formed for etching orthogonal to the direction of etching using the first pattern. The second pattern may include strips of hard mask material (e.g., TEOS), pad materials (e.g., nitride), adhesion layers (e.g., nitride) and/or photoresist, etc. or other suitable mask, that are elongated in the row direction along the x-axis with a spacing between strips in the column direction along the y-axis. The pattern defines the gate length for the charge storage region of each memory cell. Other patterning agents such as polysilicon spacers and the like may also be used.

Figure 7N:
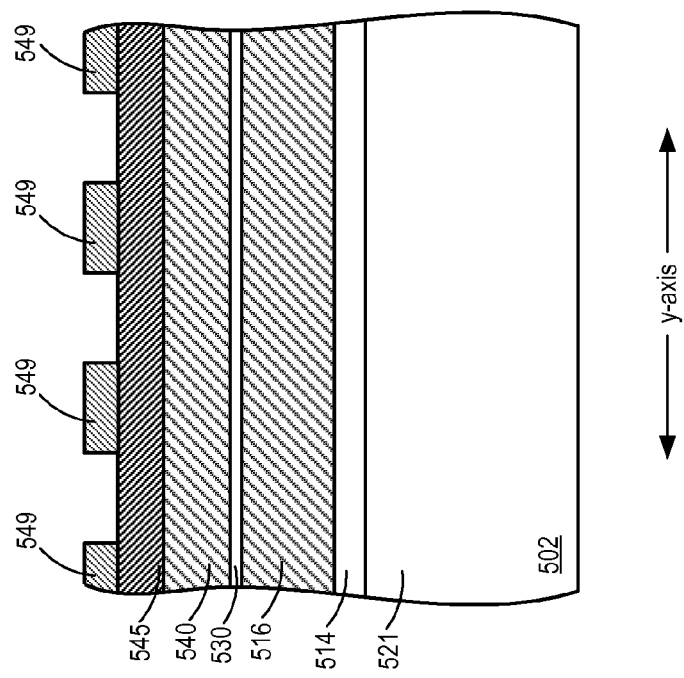
Figure 7N:
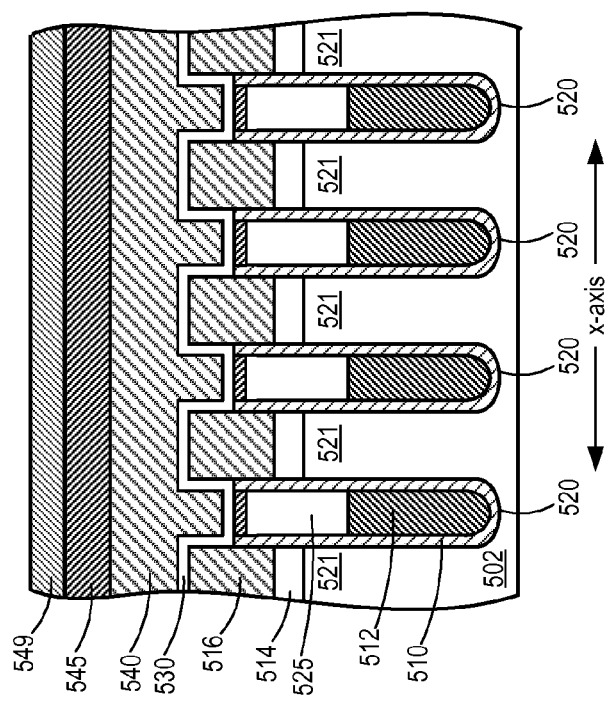
Figure 7O:
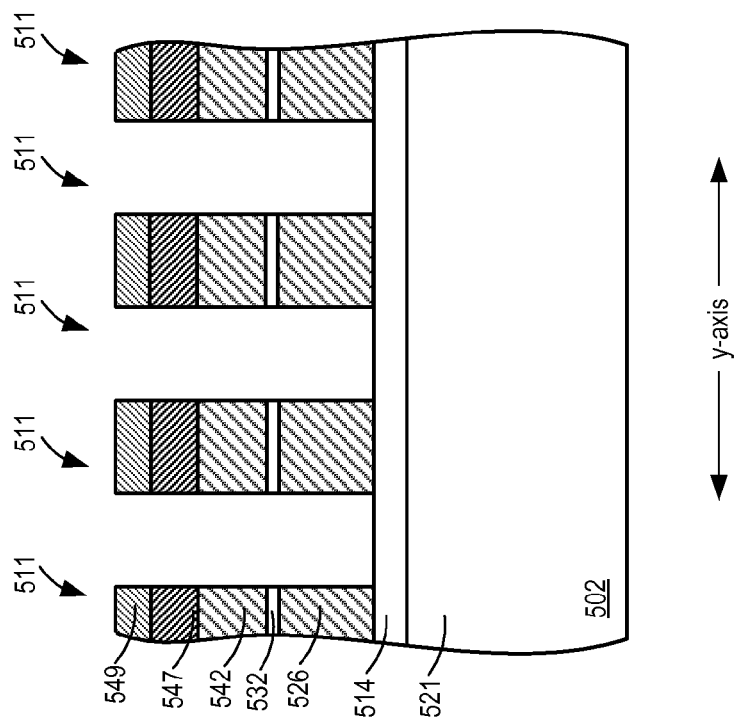
Figure 7O:
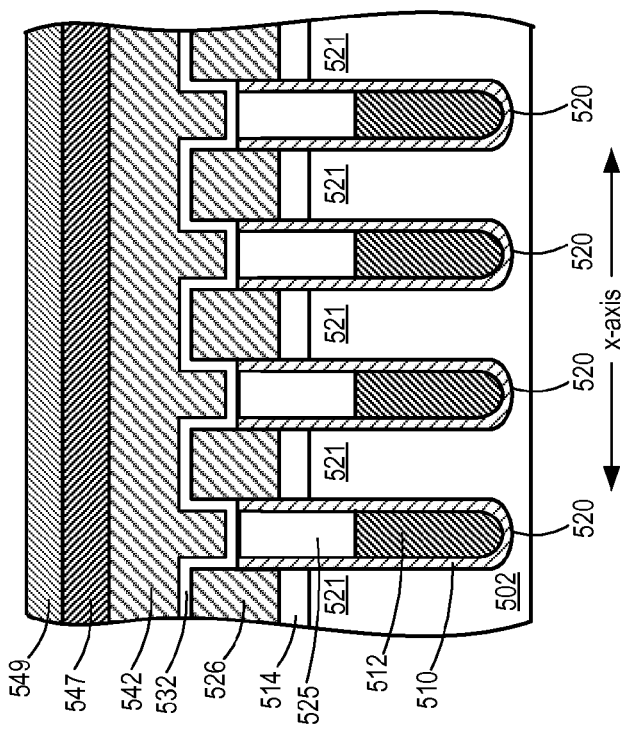

FIG. 7N depicts the results of step 424 in one embodiment. FIG. 7N depicts orthogonal cross-sectional views in both the x-axis (row) and y-axis (column) direction. The depiction in the direction of the x-axis is taken through the array along a line like that of line B-B shown in FIG. 3 and the depiction in the direction of the y-axis is taken through the array along a line like that of line A-A in FIG. 3. One or more hard mask layers 545 are formed over the control gate layer followed by strips 549 of photoresist applied for etching orthogonally to the direction of the etch depicted in FIG. 7B. The photoresist may first be used to etch the hard mask material into strips, followed by etching through the layer stack columns or a portion thereof to form the memory array.

At step 426, the layer stack is etched into layer stack rows using the pattern formed at step 424 to form a self-aligned word line structure. Reactive ion or another suitable etch process may be used. One or more etch chemistries may be applied to etch through the various layers of the stack. FIG. 7O depicts the results of an orthogonal etch performed at step 426 in one embodiment. Etching continues until reaching the tunnel dielectric layer in this example. In other examples, etching may continue until reaching the substrate surface. In another example, some portion of the tunnel dielectric layer is etched without completely etching through the layer. Etching forms layer stack rows 511. The hard masking material is etched into hard mask strips (HMS) 547 and the control gate layer is etched into control gates (CG) 542. In one embodiment, the control gates 542 form word lines. The intermediate dielectric layer 530 is etched into strips 532. The charge storage strips 516 are etched into individual charge storage regions (CSR) or floating gates 526. After etching the layer stack into rows, an implant process can be performed to create n+ source/drain regions. In one embodiment, the n+ source/drain regions are created by implanting n-type dopants such as arsenic or phosphorus into the p-well.

As shown in FIG. 7O, when the orthogonal etching reaches the air gaps 525, the wet etch chemistry may remove the air gap bridges (layer 527) remaining at the top of the air gaps. Because a low-temperature material was used for the second dielectric material (e.g., ultra-low SiO2), the etch process for forming individual storage elements and control gates may etch and remove the bridges. This will actually increase in the air gap ratio and may improve performance. It is not required that the liner material be removed. Referring back to the recess process depicted in FIG. 7K, liner 527 may also be made thicker in the formation as shown in FIG. 7E without affecting the air gap height. This may improve process throughput by making it easier to ensure that a bridging oxide remains over the air gaps as shown in FIG. 7K. The thicker liner may initially decrease the air gap height. However, once the additional layers are formed and the orthogonal etch is performed to form the storage elements, the thicker oxide will be removed and the air gap height will be increased. Thus, the liner oxide thickness may be increased without decreasing the air gap height.

At step 428, air gaps are formed in the direction of the word lines. These word line air gaps are formed at least partially in the spaces between the layer stack rows The air gaps are elongated in the x-direction. They extend in the x-direction to provide electrical isolation or shielding between elements of adjacent layer stack rows. The vertical dimension and column dimension (along y-axis) of the air gaps can vary to meet the particular requirements of a given implementation.

Figure 7P:
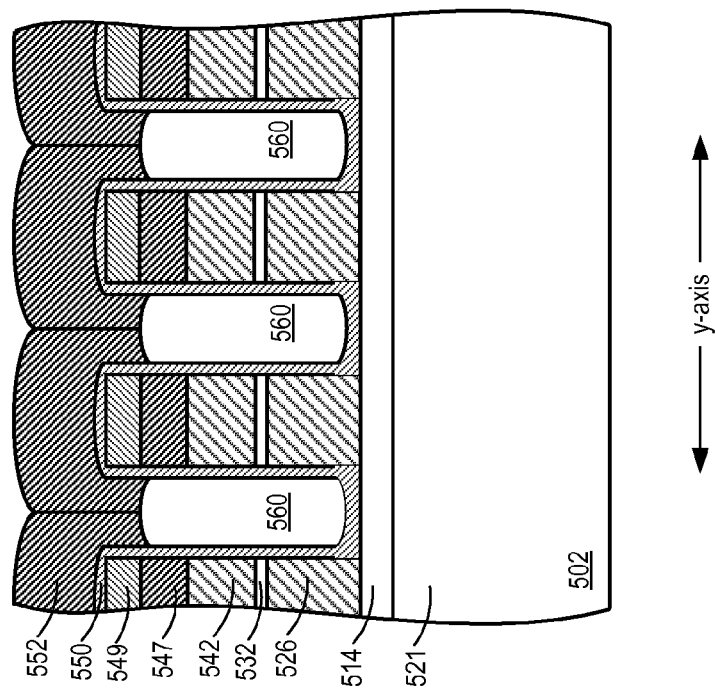
Figure 7P:
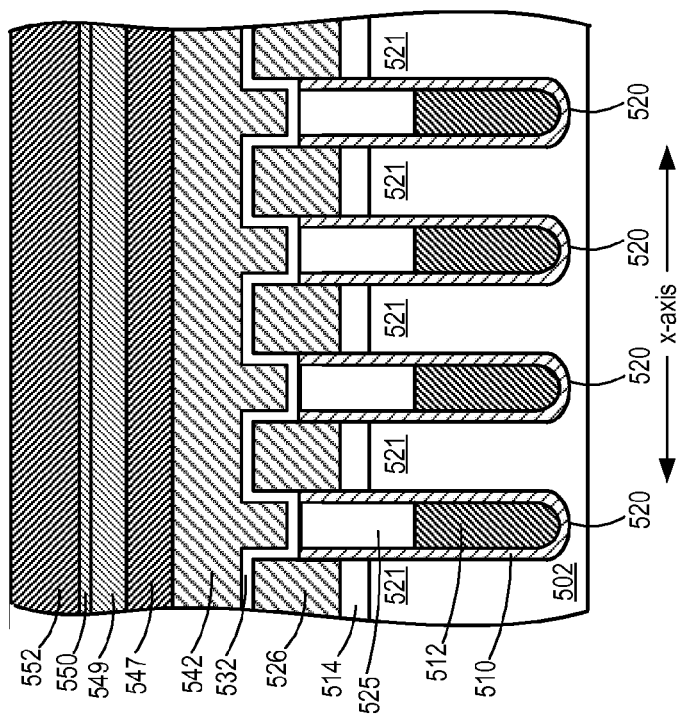

FIG. 7P depicts the results of step 530 in one embodiment. A dielectric liner 550 (e.g., oxide) is first formed using a conformal deposition process. A capping layer 552 is then formed over the layer stack rows using a non-conformal deposition process. By using a non-conformal deposition process, material 552 will be deposited unequally at the upper portion of the layer stack rows. Material 552 quickly accumulates, meeting at a location over the space between rows to form word line air gaps 560. Material 552 extends vertically toward the substrate surface along liner 550. In one embodiment, layer 552 is an oxide but other materials such as nitrides may be used in other implementations. Although not shown, some portion of dielectric 552 may enter the space between charge storage regions. This portion of the dielectric may raise the lower endpoint of the air gap in the spaces between rows, but by only a small amount. However, a very non-conformal oxide will quickly grow together to seal off the spaces as shown without a substantial decrease in the vertical dimension of the air gap. Although not shown, a polishing step can be applied to form individual caps from layer 552. The capping layer 552 can be polished to form plugs sealing the word line air gaps 560. A planar surface can be created for further processing steps.

At step 530, front end processing is completed. In one example, step 530 may include interconnecting the floating gate and control gate regions of select and peripheral circuitry transistors. Peripheral gate connections can be formed using vias or contact holes, etc. to form contacts to individual gate regions or to connect multiple transistors to a common control line. The select gate transistors can have their floating gate regions shorted to the control gate regions to form a single gate structure. Array connections can also be patterned and formed. After forming contacts, etc., further backend processing to form metal layers, etc. to complete the device according to known techniques can be performed. Various backend processes can be performed to finalize fabrication of the array. For example, a passivation dielectric layer can be deposited, followed by forming metal conductive lines and vias to connect the lines with source and drain regions at the end of the memory cell strings, etc.

Figure 9A:
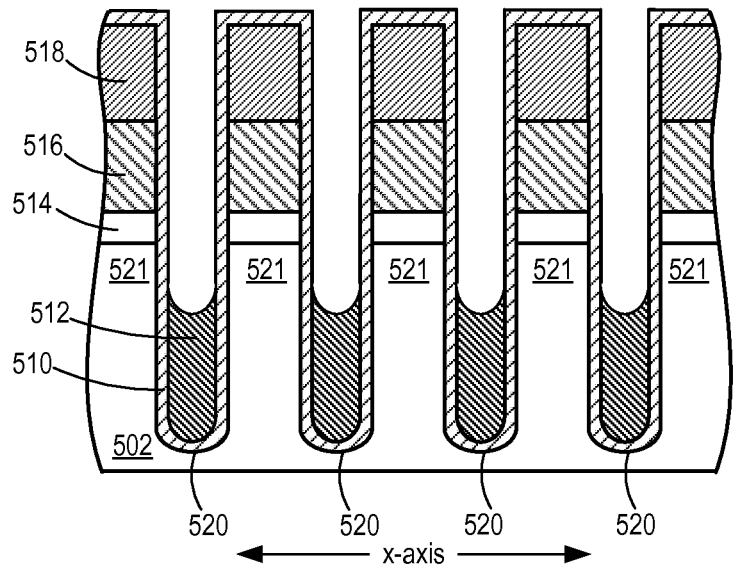
FIGS. 9A-9D are cross-sectional views through a portion of a non-volatile memory array depicting a portion of a fabrication process according to the method of FIG. 6 in one embodiment.

FIGS. 9A-9D show an embodiment where a meniscus-shaped upper surface is created for the first insulating material 512. With reference to FIG. 9A, processing as described in FIGS. 7A-7C has been performed to form layer stack columns 503, isolation regions 520 and fill material 512 partially within each of the isolation regions. In FIG. 9A, the upper surface of the insulating material has been formed with a concave or meniscus shape relative to the upper surface of the substrate. The meniscus shape may provide a larger air gap region in one embodiment by increasing the distance between the substrate surface and the upper surface of the partial fill material. In one embodiment, the meniscus is formed using a spin-on deposition technique, such as described with respect to FIG. 7D. A spin-on process used to deposit the insulating material can naturally form a meniscus shape at the small gap-fill dimensions present in some implementations.

Figure 9B:
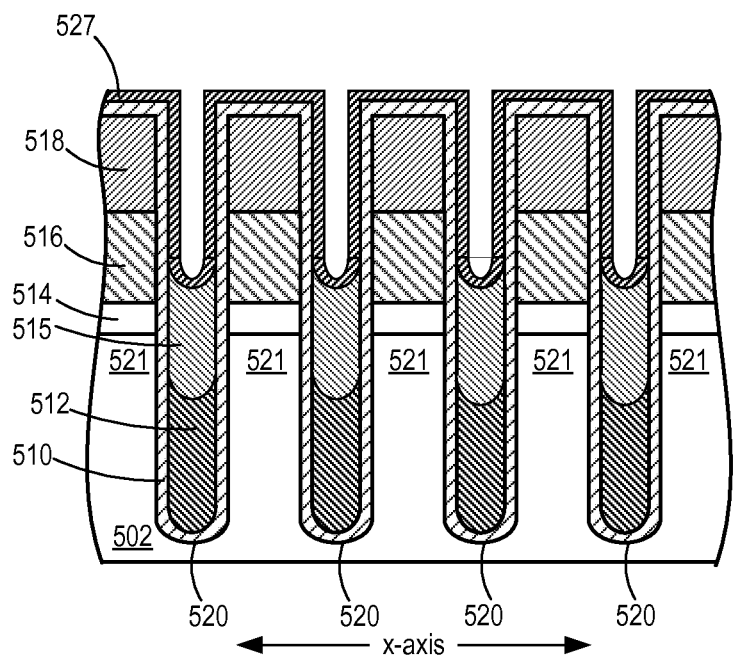
Figure 9C:
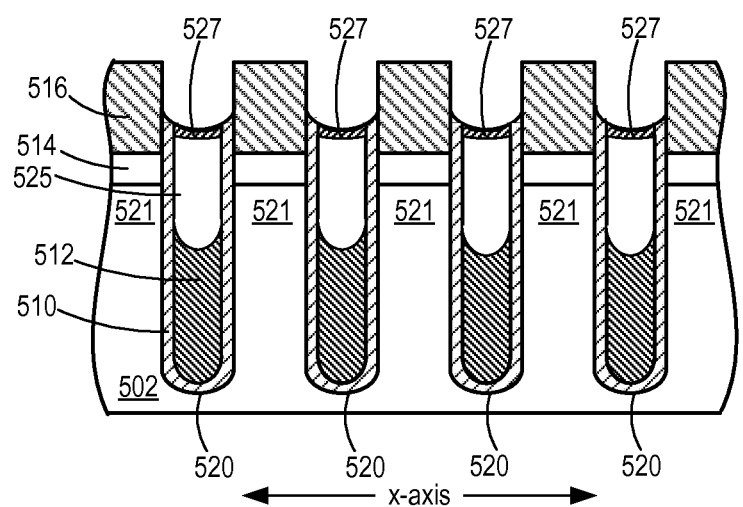
Figure 9D:
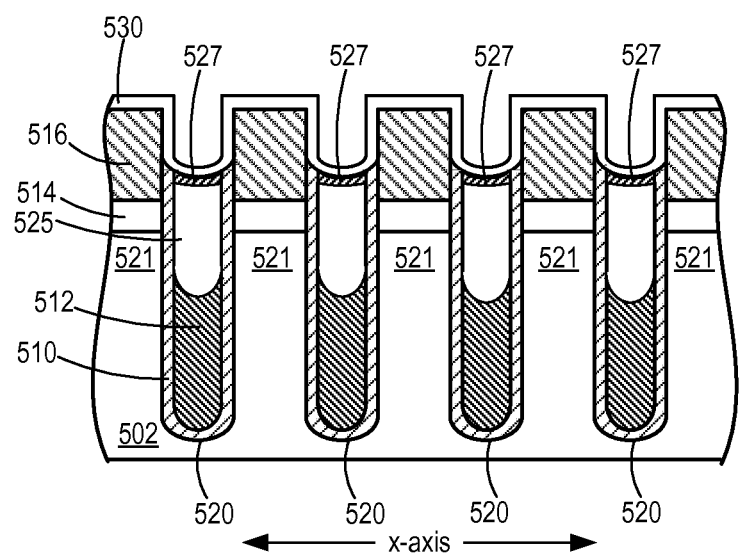

After forming the partial fill, processing continues as shown in FIG. 9B where the sacrificial film 515 is formed in the remaining portions of the isolation regions and in a portion of the space between layer stack columns. In this example, a spin-on process is again used to form the sacrificial film 515 such that it is also formed with a meniscus-shaped upper surface. FIG. 9B also illustrates the formation of the low-temperature second liner 527. In this example, the meniscus at the upper surface of the sacrificial film causes the second liner to extend vertically down into the meniscus of the sacrificial film. Processing continues as shown in FIG. 9C where the sacrificial film is removed by raising the substrate temperature to form air gaps 525. FIG. 9C also depicts processing to recess the second dielectric liner 527 and first dielectric liner 510, thereby forming air gap bridges. The intermediate dielectric layer(s) is then formed as shown in FIG. 9D, followed by the processing described with respect to FIGS. 7M-7O.

FIGS. 10A-10L are cross-sectional views depicting another fabrication sequence according to the method of FIG. 6 where a sacrificial material is etched for removal prior to the active area etching to define control gates and charge storage regions.

Figure 10A:
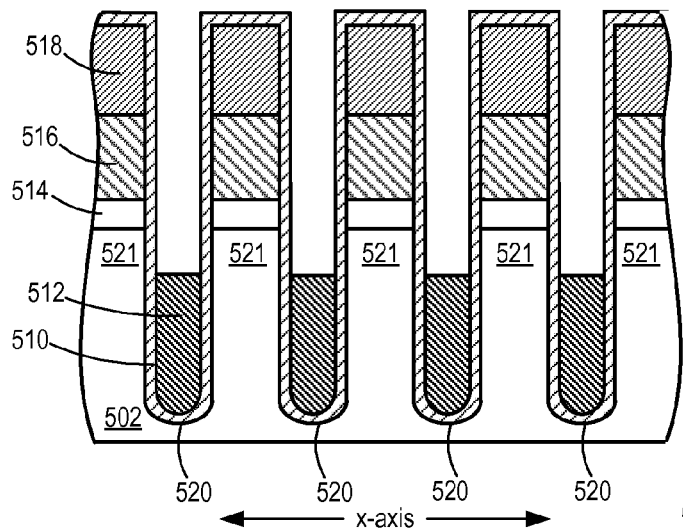
FIGS. 10A-10L are cross-sectional views through a portion of a non-volatile memory array depicting a fabrication process according to the method of FIG. 6 in one embodiment.
Figure 10B:
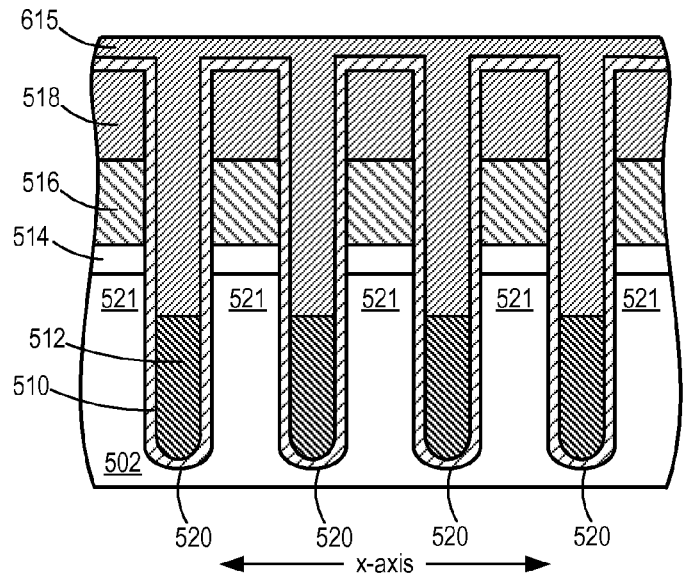
Figure 10C:
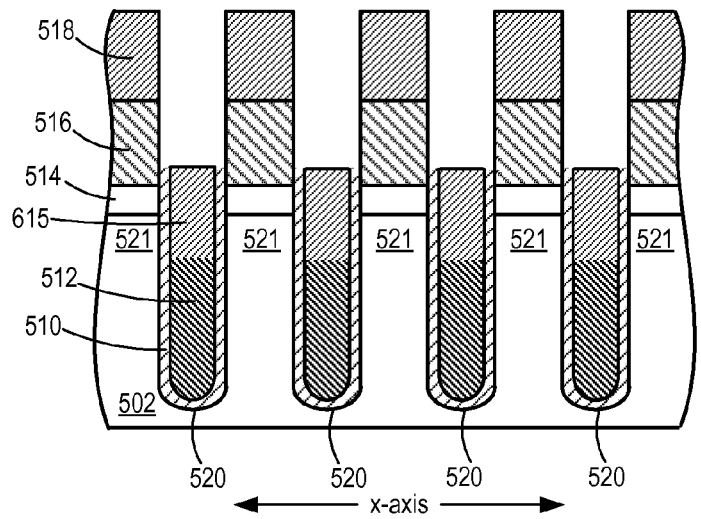

Processing as described with respect to FIGS. 7A-7C is performed, arriving at the device shown in FIG. 10A. In this example, a sacrificial layer is then formed in the remaining portions of the isolation regions, completely filling these regions and the spaces between adjacent layer stack columns as shown in FIG. 10B. A sacrificial layer 615 has been formed in isolation regions 520, overlying the first partial fill layer 512 to complete filling of the trenches. In one example, layer 615 is a sacrificial silicon nitride layer formed using a hexachloro-disilane (HCD) precursor but other fabrication processes and materials can be used. The sacrificial material is then recessed to a height below the upper surface of the charge storage strips 516. Reactive ion etching or another process can be applied to recess the nitride as shown in FIG. 10C. In one example, the sacrificial layer 517 is recessed to a height of about 7-10 nm above the upper surface of the tunnel dielectric layer 514 although other dimensions may be used. Timed etch processes can be used to control and recess the nitride to a desire level in the open spaces. The upper surface of the nitride layer can be targeted for a height corresponding to the desired upper endpoint of the bit line air gaps.

Figure 10D:
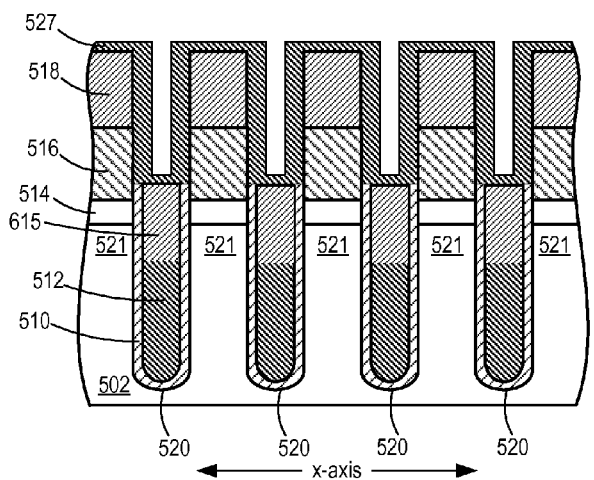

The second dielectric liner 527 is formed as shown in FIG. 10D. In this example, the second dielectric liner 527 has been made with a larger thickness than in FIG. 7E, but this is not required. A thicker liner (e.g., 5-6 nm) may provide additional protection to the charge storage region and tunnel dielectric layer with performing a later etch back process.

Figure 10E:
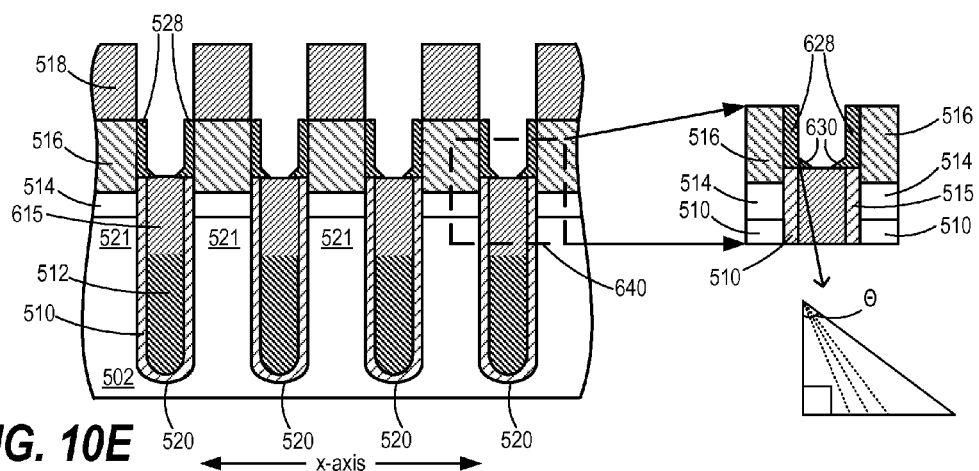

The second dielectric liner is etched back to expose at least a portion of the upper surface of the sacrificial material as shown in FIG. 10E. Reactive ion or other suitable etch processes may be used. A timed etch process can be used in one example to etch through the liner material and expose the underlying sacrificial material. Etching leaves portions of the second liner that form spacers 628 extending along the vertical sidewalls of the strips 516 of the charge storage material. As shown in the more detailed view of the area within box 640, each spacer 628 has a taper 630 at its lower area (proximal to the substrate surface) where the horizontal thickness of the liner material is thicker (extending further in the direction of the x-axis). The tapers 630 extend horizontally in the direction of the x-axis, with the taper of one portion extending horizontally over the upper surface of the nitride material 615 towards the taper of the adjacent spacer on the adjacent strip of charge storage material. In one example, the etch chemistry used in etching back the liner material 527 can be changed to form tapers 630. A reactive ion etch process can be used, using a $CH_3$ or $CH_4$ etch chemistry for example. In a later or last step of the etch sequence, the chemistry can be changed to include Fluorine and create the tapers. Other techniques for forming tapers 630 may be used.

As also shown in FIG. 10E, the tapers have a sloping upper surface edge that contacts the vertical portion of the spacer at an angle θ. In one example, the angle θ is targeted between 15 and 45 degrees, relative to vertical with respect to the substrate surface. In another example, the angle is targeted between 0 and 60 degrees. Other target angles for the tapers may be used.

Figure 10F:
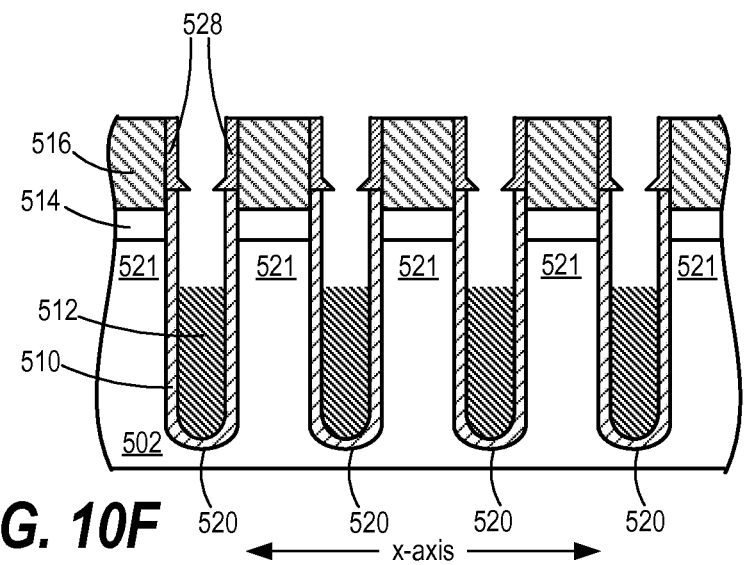

The sacrificial nitride material is removed, forming bit line air gaps 525 in the isolation regions and extending partially between adjacent layer stack columns as shown in FIG. 10F. An isotropic wet etch can be applied in one example to strip the sacrificial nitride 515. In one example, a hot $H_3PO_4$ etch is used.

Figure 10G:
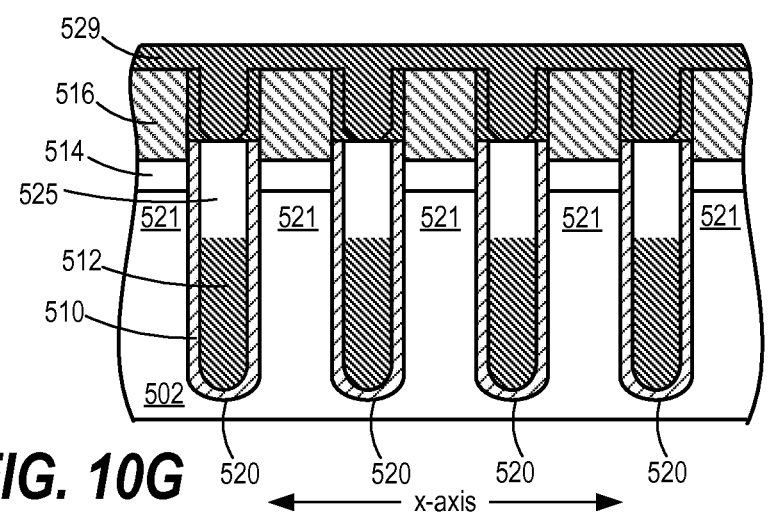

The second insulating layer is then formed over the substrate surface, followed by etching back to form air gap bridges. FIG. 10G depicts the formation of an oxide insulating material 529 in one example. Because of tapers 630 on spacers 628, the insulating fill material can more easily form and join together over the air gap regions 525. The additional tapers make the space to be covered between adjacent layer stack columns smaller. The fill material will come together between the tapers 630 above the isolation trenches 520 to seal them off. The tapers can aid in the joining of the deposited material to seal off the trenches. Some fill material may spill into the trenches, but it can be removed in a later wet etch process described below.

Figure 10H:
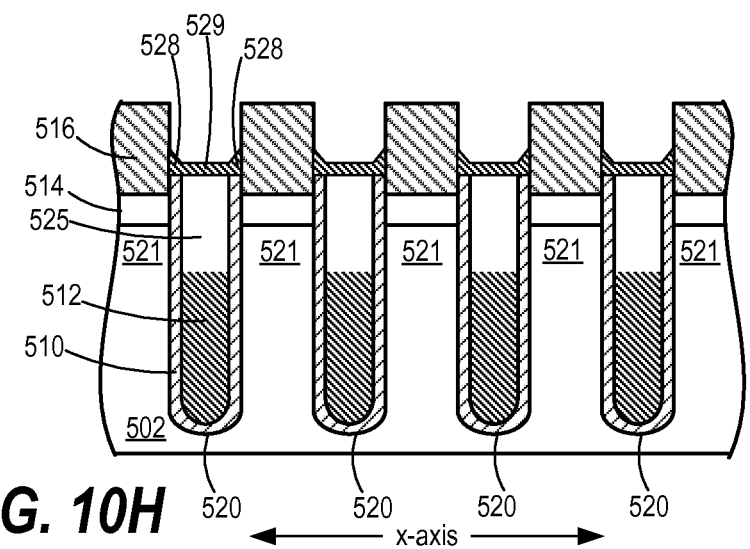

The fill layer 529 is then recessed as shown in FIG. 10H. The fill layer is not completely removed so that air gap bridges are formed over the isolation regions. The air gap bridges are formed from portions of each spacer 628 (predominantly from tapers 630) and the remaining portion of fill material 529 following etch back. The recess time can be controlled in one example to ensure that some portion of the fill material and tapers 630 remain to form the bridges. By sealing off the trenches, air gaps 525 are created.

Figure 10I:
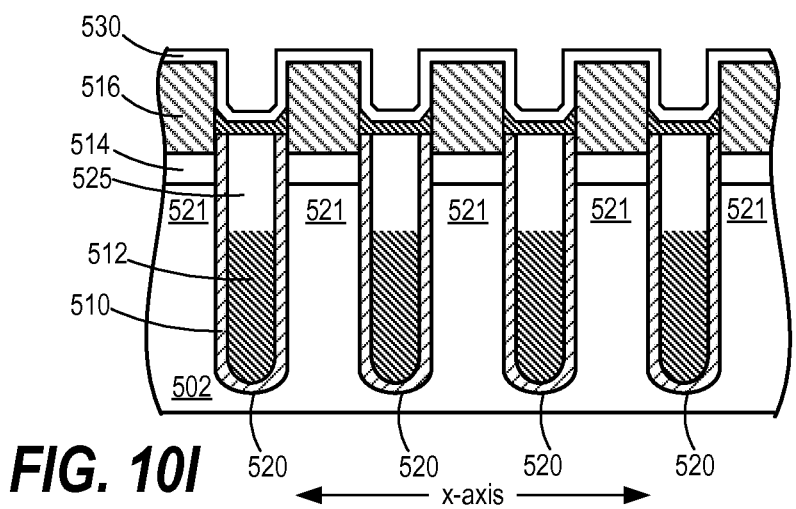
Figure 10J:
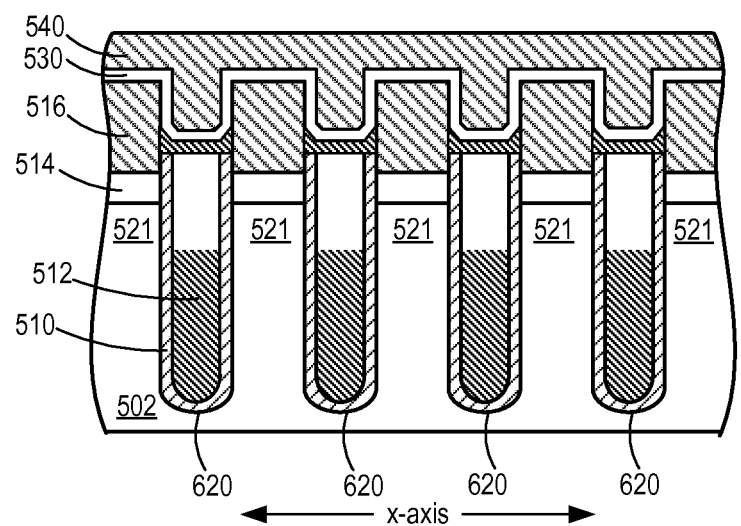
Figure 10K:
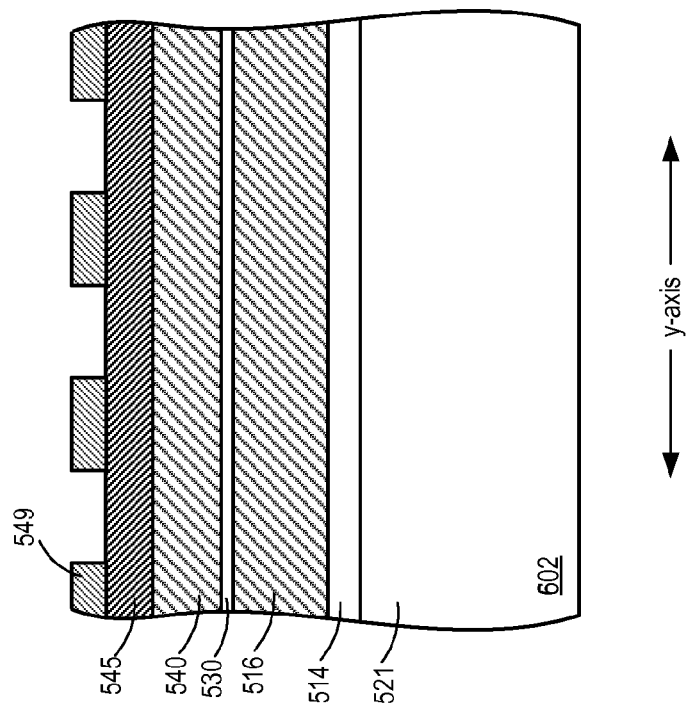
Figure 10K:
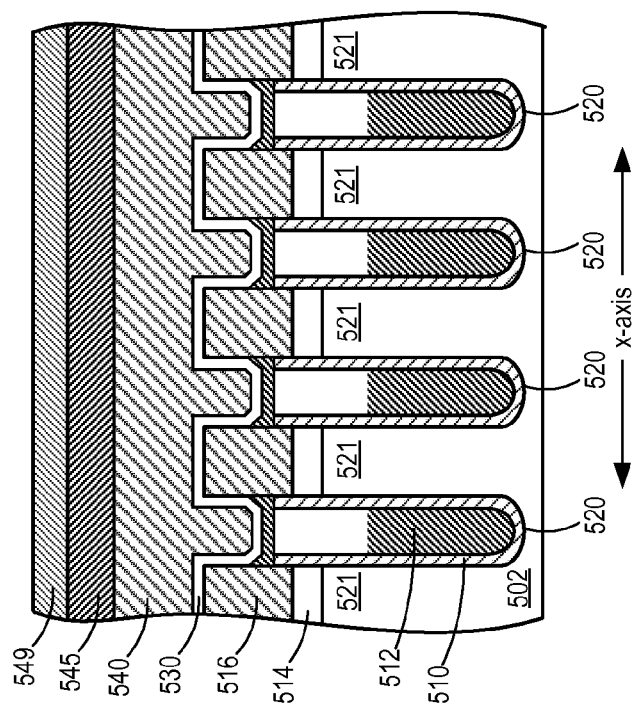
Figure 10L:
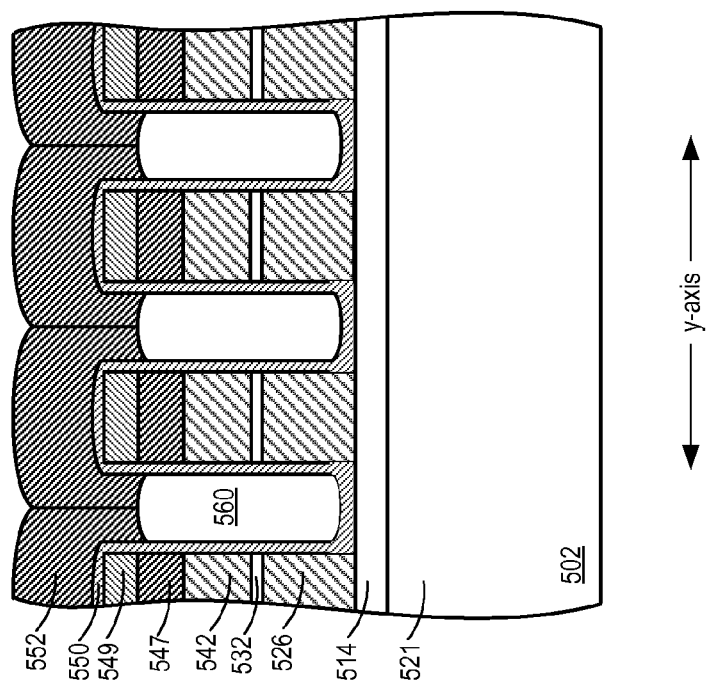
Figure 10L:
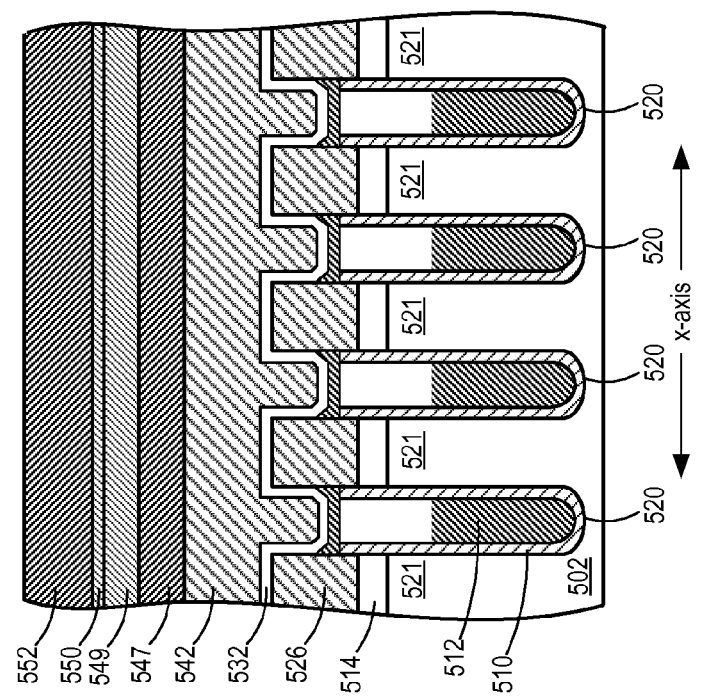

Processing then continues as earlier described. The intermediate dielectric layer 530 and control gate layer 540 are formed as shown in FIGS. 10I-10J. A second pattern is then formed as shown in FIG. 10K. The layer stack is etched into layer stack columns, forming a self-aligned word line structure. Word line air gaps 560 are then formed, followed by the completion of front-end processing as shown in FIG. 10L. The air gap bridges remain in the structure of FIG. 10L in one embodiment. Because the bridges are formed from a standard temperature dielectric, the etch forming the individual storage elements does not remove the air gap bridges. In other examples, different materials and/or processes may be used causing removal of the air gap bridges.

Like the embodiment depicted in FIGS. 9A-9D, a meniscus shape can be formed in the upper surface of the partial dielectric fill 512. Because the sacrificial material is formed by an etchback process instead of a spin-on coating process, it's upper surface will have a planar upper surface as opposed to the upper surface of the sacrificial fill material in FIG. 9B.

Figure 11A:
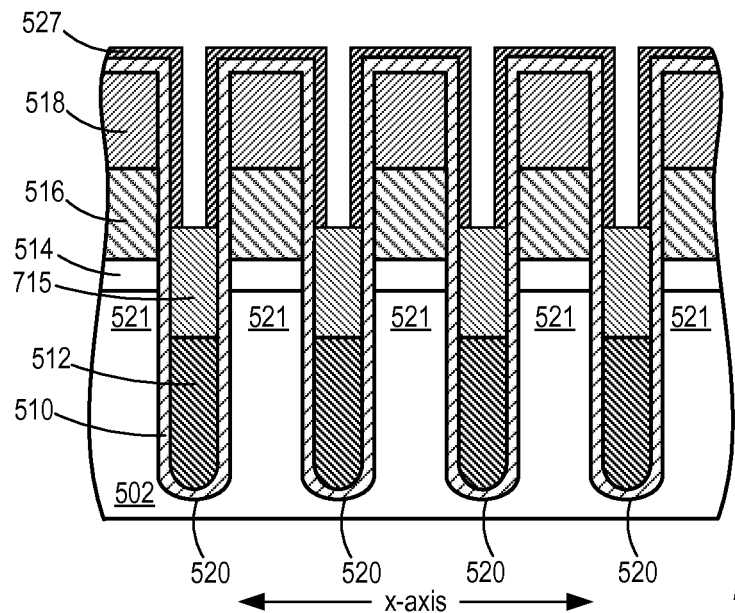
FIGS. 11A-11G are cross-sectional views through a portion of a non-volatile memory array depicting a fabrication process according to the method of FIG. 6 in one embodiment.

FIGS. 11A-11G are orthogonal cross-sectional views depicting a fabrication sequence according to the method of FIG. 6 that includes using a sacrificial resist material in the isolation regions that is removed user laser processing prior to the active area etching to define control gates and charge storage regions. FIG. 11A depicts the formation of a sacrificial resist 715 in one example. Resist 715 can be formed by conventional lithography techniques. In one example, the resist is deposited or otherwise formed over the substrate and then recessed to a desired height in the isolation regions. In another example, a spin-on process can be used to selectively form resist 560 in the isolation regions without using an etch back process. The resist may be formed in a liquid state, and then cured to form a solid resist structure. The resist can be formed with its upper surface at a level of about 7-10 nm above the upper surface of the tunnel dielectric layer 504, although other dimensions may be used.

The second dielectric liner 527 is formed along the vertical sidewalls of the first dielectric liner. In one embodiment, the second dielectric liner is formed of a low-temperature oxide such as ultra-low temperature $SiO2$. A low-temperature liner, formed at less than the cure temperature of the resist material facilitates removal of the resist material in later processing steps. FIG. 11A also depicts second dielectric liner. In this example, it can be seen that the dielectric liner is not formed completely over the upper surface of the sacrificial resist material. In one embodiment, an oxide second dielectric material naturally does not form on the sacrificial resist material. In another embodiment, the second dielectric liner may be formed over the upper surface of the sacrificial resist. In such a case, the second dielectric may be an optically transparent oxide that permits the transfer of ultraviolet light.

Figure 11B:
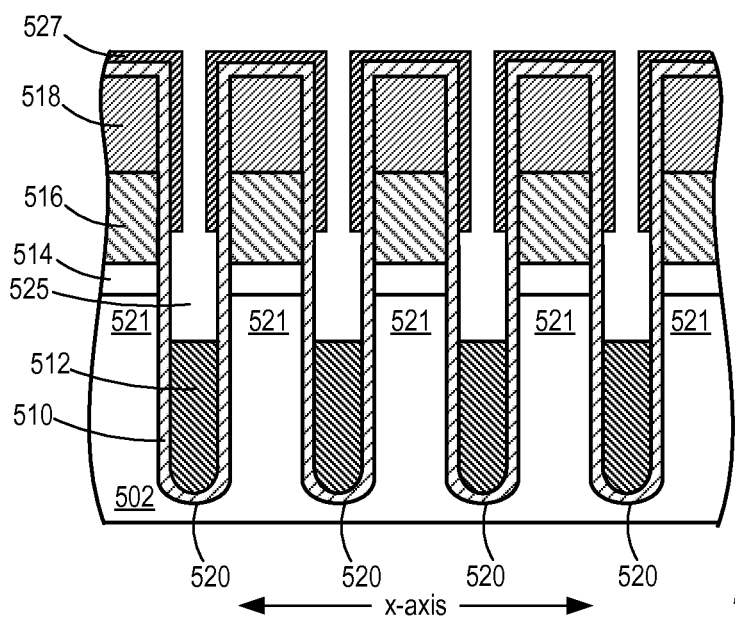

The sacrificial resist is then removed, forming bit line air gaps in the isolation regions. FIG. 11B depicts the removal and formation of sacrificial resist 715 in isolation regions 520 to form bit line air gaps 525. The sacrificial resist is exposed to ultraviolet light wavelength(s) in one example. The wavelength(s) correspond to the decomposition wavelength for the resist material. A Krypton Fluoride (KrF) or Argon Fluoride (ArF) laser is used in one embodiment. The UV light exposure decomposes the resist material 715, forming air gaps 525 in the isolation regions 520. In an alternate embodiment a wet etch chemistry such as a sulfuric acid and hydrogen peroxide (SH) etch chemistry may be used to remove the resist.

The second insulating material is then formed over the substrate, filling the spaces between adjacent portions of the second dielectric liner 527. The insulating material fills the remaining space between adjacent layer stack columns. The material forms over the air gap 525 region by the small area or dimension remaining in each space between the second dielectric liner. Some amount of material may fill into the trench, but it will not completely fill the isolation regions. Furthermore, a later wet etch process used to etch the active area layer stacks in cell formation will remove any of this spillover material.

Figure 11C:
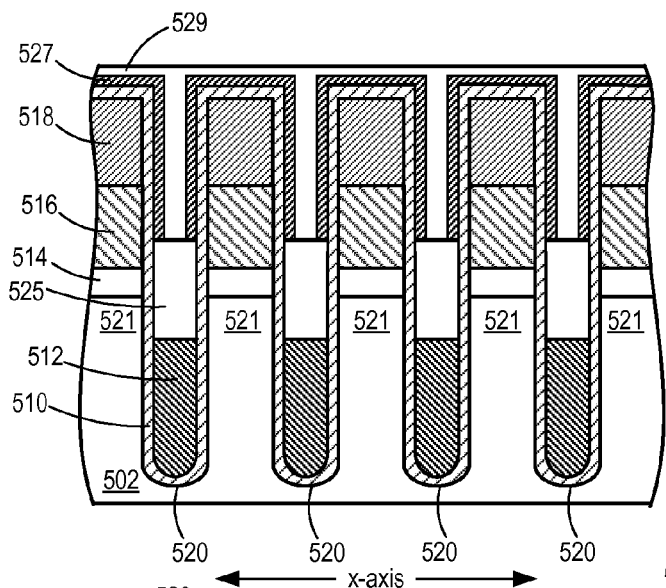
Figure 11D:
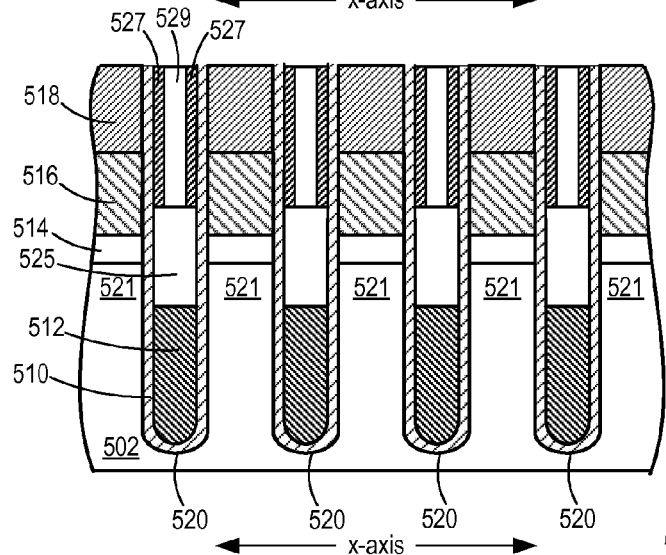
Figure 11E:
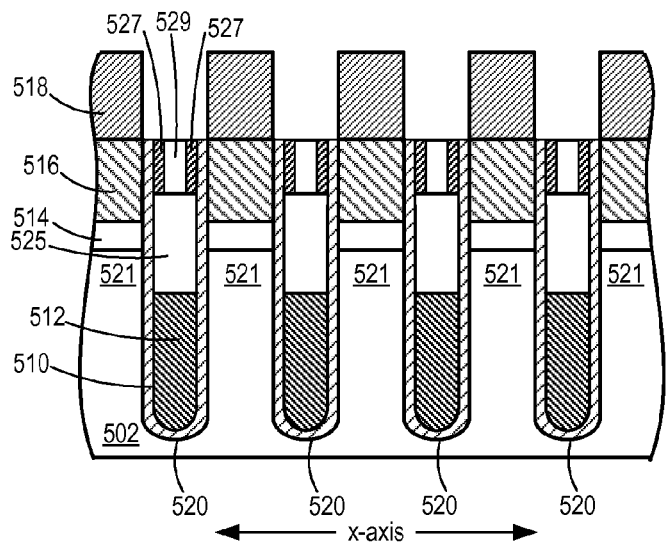
Figure 11F:
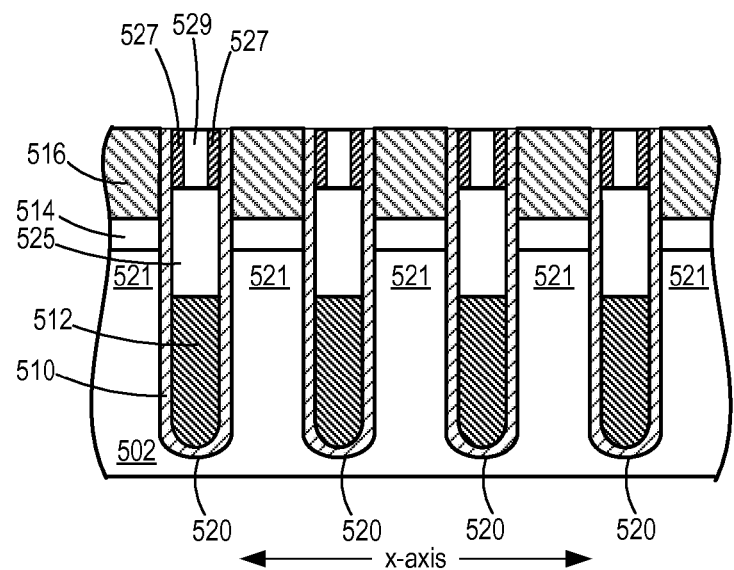
Figure 11G:
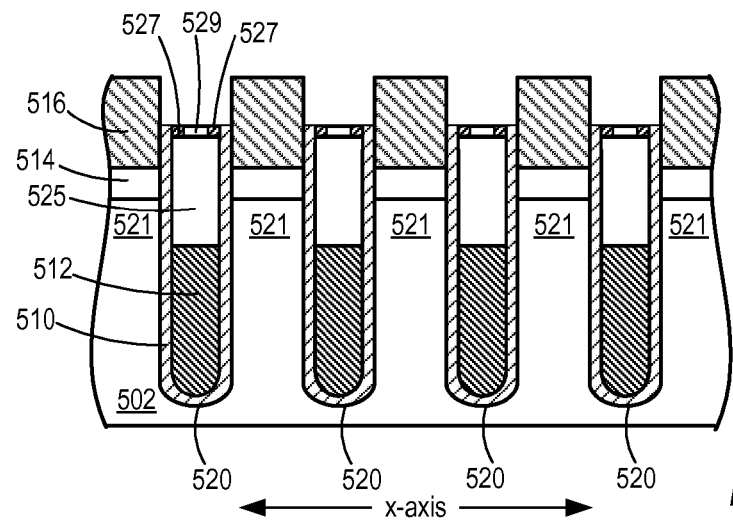
Figure 12:
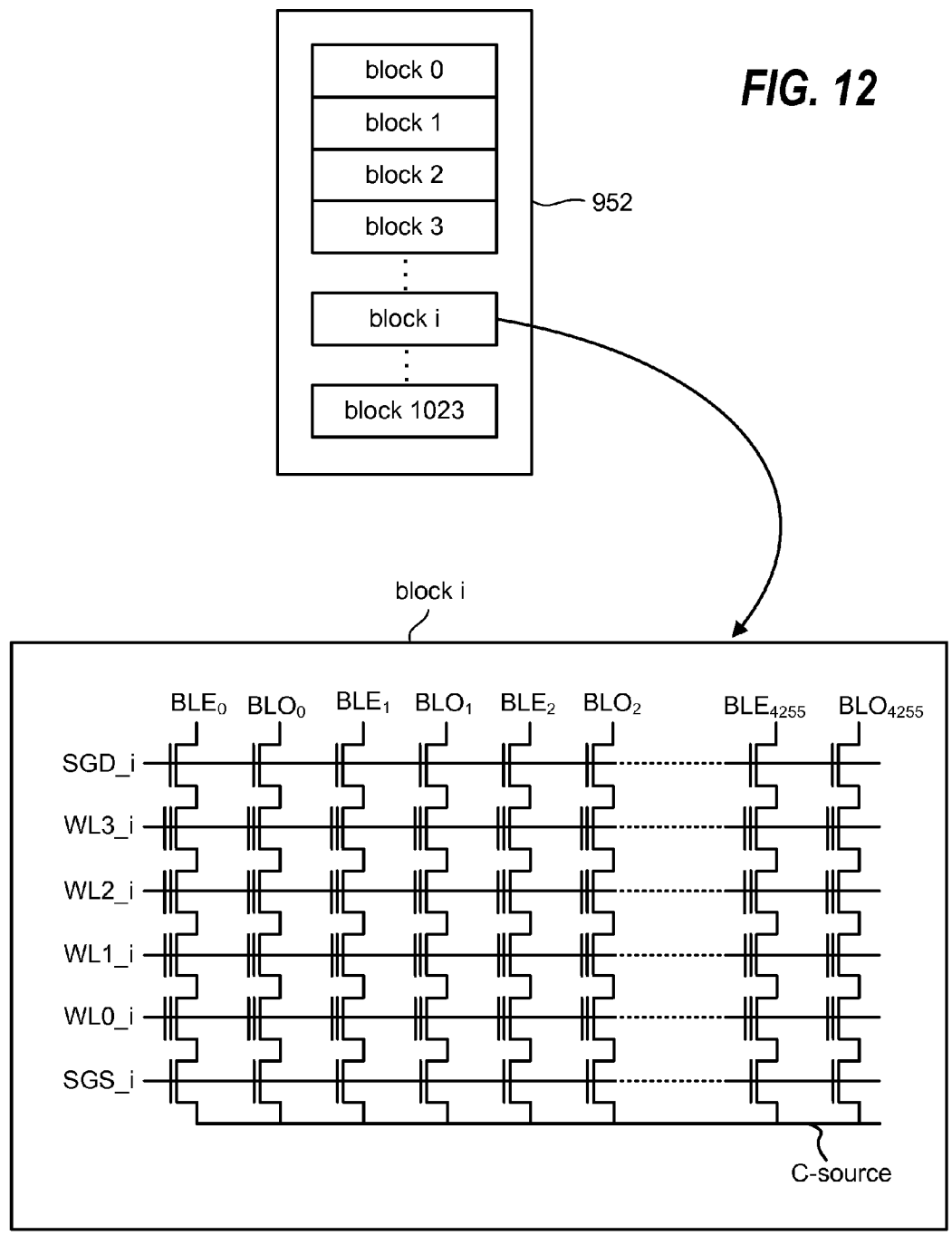
FIG. 12 depicts an example of the organization of a memory array in accordance with one embodiment.

FIGS. 11C-11G describe the formation of the bit line air gap bridges in one example. The dielectric fill material 529 is first applied as shown in FIG. 11C, followed by a polishing or etch-back process to remove any portions of layers 510, 527 and 529 that overlie horizontal upper surfaces of the layer stack columns as shown in FIG. 11D. The first and second dielectric liners and dielectric fill material are then recessed to the level of the upper surface of the charge storage strips 516 as shown in FIG. 11E. The nitride strips 518 are then removed, using a wet strip process (e.g., H3PO4) for example, as shown in FIG. 11F. The dielectrics are then recessed again to form the final air gap bridges as shown in FIG. 11G. A dry or wet etch process can be applied to recess the dielectrics. The process is controlled to prevent the removal of too much oxide and consequent exposure of the air gaps 525. Timed etch processes are used in one example. As illustrated, the air gap bridges include a portion of the dielectric fill material and the second dielectric liner. The lower surface of the air gap bridges defines the upper endpoint for the underlying air gap. Processing then continues as described in the earlier embodiments. Like the embodiment depicted in FIGS. 9A-9D, a meniscus shape can be formed in the upper surface of the partial dielectric fill FIG. 12 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 12 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 13:
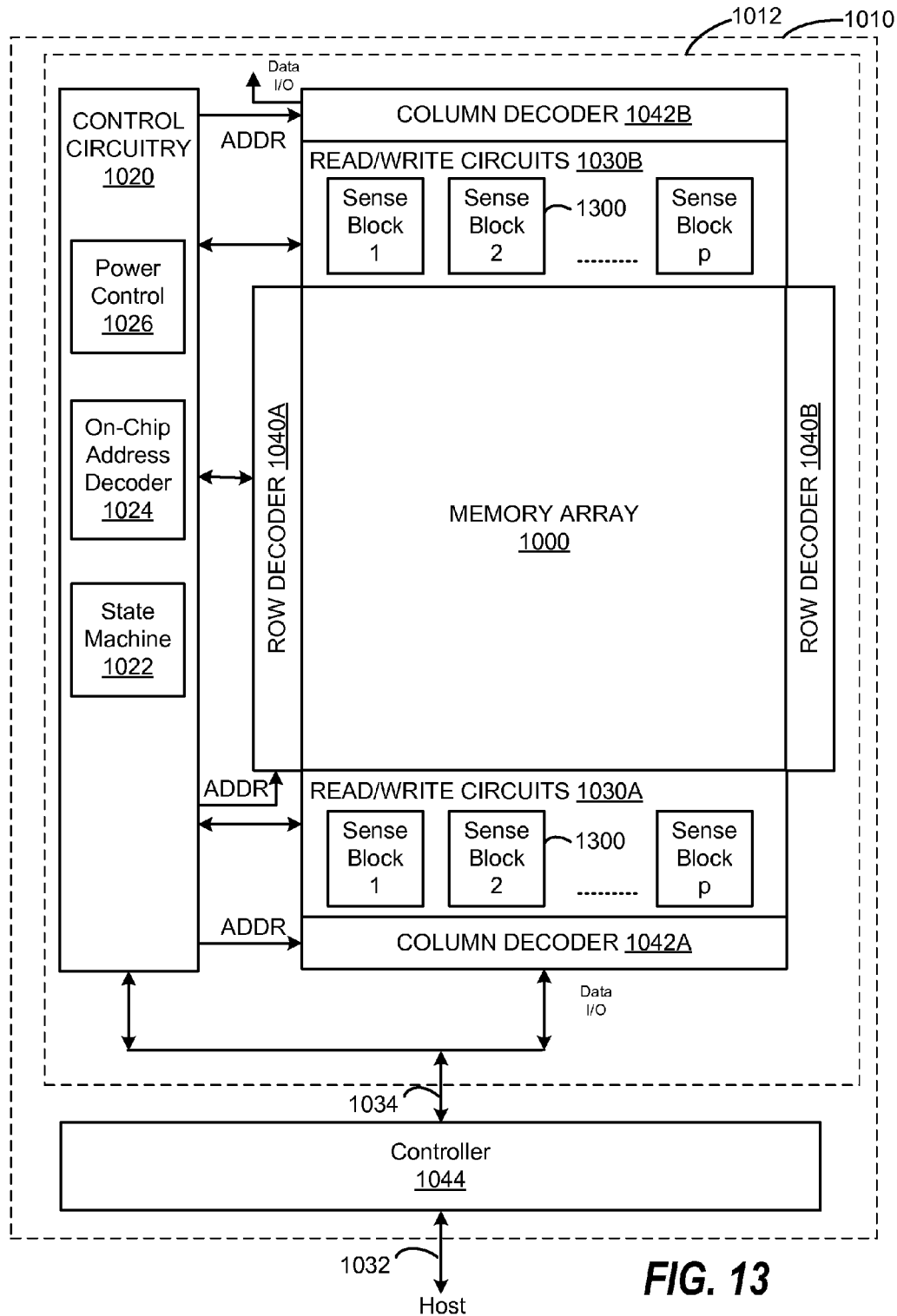
FIG. 13 is a block diagram depicting an example of a memory system that can be fabricated or used to implement embodiments of the disclosed technology.

FIG. 13 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 14:
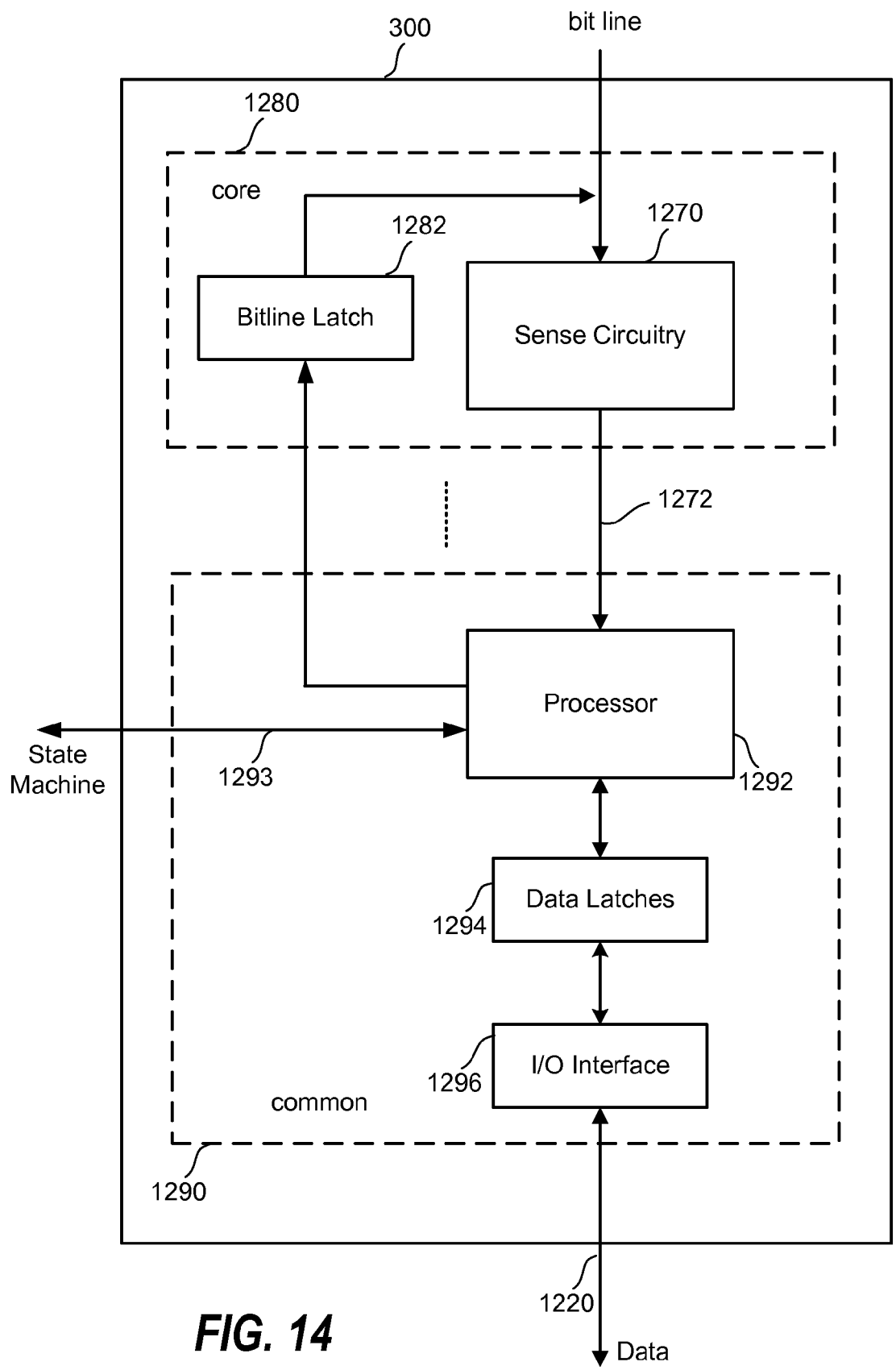
FIG. 14 is a block diagram depicting one embodiment of a sense block.

FIG. 14 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method performed as part of fabricating non-volatile storage, comprising:
    forming a plurality of layer stack columns overlying a plurality of active areas of a substrate, each active area having two vertical sidewalls and being separated from an adjacent active area by a plurality of isolation regions in the substrate;
    partially filling the isolation regions with a first insulating material;
    forming a sacrificial material over the first insulating material in each isolation region, the sacrificial material extending above a level of a surface of the substrate;
    forming a dielectric liner vertically along the vertical sidewalls of each layer stack column;
    removing the sacrificial material after forming the dielectric liner to define a plurality of bit line air gaps extending vertically from an upper surface of the first insulating material to at least the level of the surface of the substrate;
    forming an intermediate dielectric layer after removing the sacrificial material; and
    forming a control gate layer after forming the intermediate dielectric layer.

2. A method according to claim 1, wherein forming a plurality of layer stack columns includes etching a layer stack to define the plurality of layer stack columns and a plurality of openings separating layer stack columns adjacent in a row direction, each layer stack column includes a strip of charge storage material, the method further comprising:

filling the plurality of openings with a second insulating material after removing the sacrificial material; and recessing the second insulating material and the dielectric liner below a level of an upper surface of the strips of charge storage material, thereby forming a plurality of bridges overlying the plurality of isolation regions, each bridge including at least a portion of the dielectric liner.

3. A method according to claim 2, wherein:
forming the dielectric liner includes forming the dielectric liner over an upper surface of the sacrificial material in each isolation region:

the method further comprises etching back the dielectric liner to form a plurality of spacers and expose the upper surface of the sacrificial material, each spacer extending vertically along one vertical sidewall of one layer stack column and including a taper at a lower end portion proximal to the substrate surface; and filling the plurality of openings includes depositing the second insulating material to form the plurality of bridges, each bridge including the portion of the dielectric liner and a portion of the second insulating material.

4. A method according to claim 3, wherein:
the sacrificial material is a sacrificial nitride; and
removing the sacrificial material includes etching to remove the sacrificial nitride.

5. A method according to claim 2, wherein:
the sacrificial material is a sacrificial resist; and
removing the sacrificial material includes exposing the substrate to ultraviolet light at a wavelength to decompose the sacrificial resist.

6. A method according to claim 5, wherein:
the dielectric liner is optically transparent to the wavelength of the ultraviolet light.

7. A method according to claim 2, wherein:
the sacrificial material is a spin-on dielectric having a first decomposition temperature;
the dielectric liner is formed in a process at a lower temperature than the first decomposition temperature; and
removing the sacrificial material includes raising a temperature of the substrate to at least the first decomposition temperature.

8. A method according to claim 2, wherein:
forming an intermediate dielectric layer comprises conformally depositing the intermediate dielectric layer after recessing the second insulating material, the intermediate dielectric layer overlying the bridges and an upper surface of the charge storage strips and extending along the vertical sidewalls of each layer stack column;
the control gate layer is formed over the intermediate dielectric layer; and
the method further comprises etching the control gate layer, the intermediate dielectric layer and the plurality of layer stack columns to form a plurality of control gates elongated in the row direction over a plurality of strips of the intermediate dielectric layer, each charge storage strip being etched into a column of charge storage regions.

9. A method according to claim 8, further comprising:
non-conformally depositing a third insulating material to form a capping layer and define a plurality of word line air gaps, each word line air gap elongated between an adjacent pair of control gates and extending vertically from a level above the substrate surface to at least a level of an upper surface of each control gate.

10. A method of fabricating non-volatile storage, comprising:
forming a first layer stack column and a second layer stack column elongated in a column direction over a substrate, each layer stack column having two vertical sidewalls and including a charge storage strip over a tunnel dielectric strip, the first layer stack column overlying a first active area of the substrate and the second layer stack column overlying a second active area of the substrate;

etching the substrate to define an isolation region between the first active area and the second active area;

forming a first insulating material partially in the isolation region;

forming a sacrificial material in the isolation region after forming the first insulating material;

forming a liner over the sacrificial material having a decomposition temperature higher than a decomposition temperature of the sacrificial material;

raising a temperature of the substrate to at least the decomposition temperature of the sacrificial material;

forming an air gap within the isolation region by removing the sacrificial material;

forming an intermediate dielectric layer and a control gate layer after forming the air gap; and etching the control gate layer, the intermediate dielectric layer, the first layer stack column and the second layer stack column to form from the control gate layer a plurality of control gates elongated in a row direction, from the charge strip of the first layer stack column a first plurality of charge storage regions, and from the charge storage strip of the second layer stack column a second plurality of charge storage regions.

11. A method according to claim 10, further comprising:
non-conformally depositing a third insulating material to form a capping layer and define a plurality of word line air gaps, each word line air gap elongated between an adjacent pair of control gates and extending vertically from a level above the substrate surface to at least a level of an upper surface of each control gate.

12. A method according to claim 10, wherein the liner is a second liner, the method further comprising:
forming a first liner in the isolation region prior to forming the first insulating material.

13. A method according to claim 12, wherein:
forming a first insulating material partially in the isolation region includes performing a first spin-on deposition process to control formation of the first insulating material to a depth corresponding to a target lower endpoint for the air gap; and forming a sacrificial material in the isolation region after forming the first insulating material includes performing a second spin-on deposition process to control formation of the sacrificial material to a depth corresponding to a target upper endpoint for the air gap.

14. A method performed as part of fabricating non-volatile storage, comprising:
forming a plurality of layer stack columns overlying a plurality of active areas of a substrate, each active area having two vertical sidewalls and being separated from an adjacent active area by a plurality of isolation regions in the substrate;

partially filling the isolation regions with a first insulating material;

forming a sacrificial material over the first insulating material in each isolation region, the sacrificial material extending above a level of a surface of the substrate;

forming a dielectric liner vertically along the vertical sidewalls of each layer stack column;

etching back the dielectric liner to form a plurality of spacers extending vertically along the vertical sidewalls of the plurality of layer stack columns;

removing the sacrificial material after forming the plurality of spacers; and filling and etching back a second insulating material to form a plurality of bridges overlying the plurality of isolation regions and define a plurality of bit line air gaps extending vertically from an upper surface of the first insulating material to at least the level of the surface of the substrate.

15. A method according to claim 14, wherein:

forming the dielectric liner includes forming the dielectric liner over an upper surface of the sacrificial material in each isolation region; and etching back the dielectric liner includes forming a taper at a lower end portion of each spacer proximal to the substrate surface.

16. A method according to claim 14, wherein:

the sacrificial material is a sacrificial nitride; and removing the sacrificial material includes etching to remove the sacrificial nitride.

17. A method according to claim 14, wherein:

the sacrificial material is a sacrificial resist; and removing the sacrificial material includes exposing the substrate to ultraviolet light at a wavelength to decompose the sacrificial resist.

18. A method according to claim 17, wherein:

the dielectric liner is optically transparent to the ultraviolet light wavelength.

19. A method according to claim 14, further comprising:

conformally depositing an intermediate dielectric layer after recessing the second insulating material, the intermediate dielectric overlying the bridges and an upper surface of the charge storage strips and extending along the vertical sidewalls of each layer stack column;

forming a control gate layer over the intermediate dielectric layer; and etching the control gate layer, the intermediate dielectric layer and the plurality of layer stack columns to form a plurality of control gates elongated in the row direction over a plurality of strips of the intermediate dielectric layer, each charge storage strip being etched into a column of charge storage regions.

20. A method according to claim 17, further comprising:

non-conformally depositing a third insulating material to form a capping layer and define a plurality of word line air gaps, each word line air gap elongated between an adjacent pair of control gates and extending vertically from a level above the substrate surface to at least a level of an upper surface of each control gate.

* * * * *